US012765066B2

(12) United States Patent
Kuo et al.

(10) Patent No.: US 12,765,066 B2
(45) Date of Patent: Oct. 13, 2026

(54) METHODS FOR FORMING TRENCH CAPACITOR CELLS INCLUDING FORMING A BLOCKING STRUCTURE IN A PORTION OF A TRENCH PRIOR TO FORMING FIRST CAPACITOR AND SECOND CAPACITOR ON EITHER SIDES AND DIRECTLY CONTACTING THE BLOCKING STRUCTURE

(71) Applicant: Taiwan Semiconductor Manufacturing Company, Ltd., Hsin-Chu (TW)

(72) Inventors: Fu-Chiang Kuo, Hsinchu City (TW); Meei-Shiou Chern, Hsinchu County (TW); Jyun-Ting Hou, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 822 days.

(21) Appl. No.: 18/188,294

(22) Filed: Mar. 22, 2023

(65) Prior Publication Data

US 2024/0105707 A1 Mar. 28, 2024

Related U.S. Application Data

(60) Provisional application No. 63/410,080, filed on Sep. 26, 2022.

(51) Int. Cl.
*H10D 86/85* (2025.01)
*H10D 86/01* (2025.01)
(Continued)

(52) U.S. Cl.
CPC ............ *H10D 86/85* (2025.01); *H10D 86/01* (2025.01); *H10P 90/1906* (2026.01);
(Continued)

(58) Field of Classification Search
CPC .......................... H10D 86/85; H10W 10/0142
See application file for complete search history.

(56) References Cited

U.S. PATENT DOCUMENTS 9,159,723 B2 10/2015 Chou et al.
12,424,538 B2 * 9/2025 Kuo ...................... H10D 1/042
(Continued)

FOREIGN PATENT DOCUMENTS

TW 200303595 A 9/2003
TW 201230254 A 7/2012

*Primary Examiner* — Anh D Mai
(74) *Attorney, Agent, or Firm* — HAYNES AND BOONE, LLP

(57) ABSTRACT

Semiconductor structures and methods are provided. An exemplary method according to the present disclosure includes forming a trench extending into a substrate, in a top view, the trench extends lengthwise along a first direction, forming a material layer over the substrate and intersecting a first portion of the trench, after the forming of material layer, forming a first capacitor intersecting a second portion of the trench, the first capacitor comprising a first plurality of conductor plates, and forming a second capacitor intersecting a third portion of the trench, the second capacitor comprising a second plurality of conductor plates, where the first plurality of conductor plates and the second plurality of conductor plates are in direct contact with the material layer.

20 Claims, 18 Drawing Sheets

(51) Int. Cl.

| | |
|---|---|
| ***H10P 90/00*** | (2026.01) |
| ***H10W 10/00*** | (2026.01) |
| ***H10W 10/10*** | (2026.01) |
| ***H10W 10/17*** | (2026.01) |

(52) U.S. Cl.

CPC ....... *H10W 10/014* (2026.01); *H10W 10/061* (2026.01); *H10W 10/17* (2026.01); *H10W 10/181* (2026.01)

(56) References Cited

U.S. PATENT DOCUMENTS

| | | | | |
|---|---|---|---|---|
| 2018/0076276 | A1 | 3/2018 | Chou et al. | |
| 2022/0028825 | A1* | 1/2022 | Jeng ...................... | H10W 70/09 |
| 2022/0102482 | A1 | 3/2022 | Tsai et al. | |
| 2022/0278095 | A1* | 9/2022 | Kao ......................... | H10D 1/68 |
| 2023/0352404 | A1* | 11/2023 | Kuo ...................... | H10W 20/40 |
| 2023/0369213 | A1* | 11/2023 | Kuo ......................... | H10D 1/68 |
| 2025/0220934 | A1* | 7/2025 | Du ......................... | H10D 1/716 |
| 2026/0006805 | A1* | 1/2026 | Tien ....................... | H10D 1/042 |

* cited by examiner

METHODS FOR FORMING TRENCH CAPACITOR CELLS INCLUDING FORMING A BLOCKING STRUCTURE IN A PORTION OF A TRENCH PRIOR TO FORMING FIRST CAPACITOR AND SECOND CAPACITOR ON EITHER SIDES AND DIRECTLY CONTACTING THE BLOCKING STRUCTURE

PRIORITY

This application claims the priority of U.S. Provisional Application Ser. No. 63/410,080, filed Sep. 26, 2022, entitled "Semiconductor Structures And Methods Of Forming The Same" the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, various methods have been developed to form capacitors and blocking structures to isolate adjacent capacitors. While existing capacitors and blocking structures are generally adequate in isolating active region segments, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
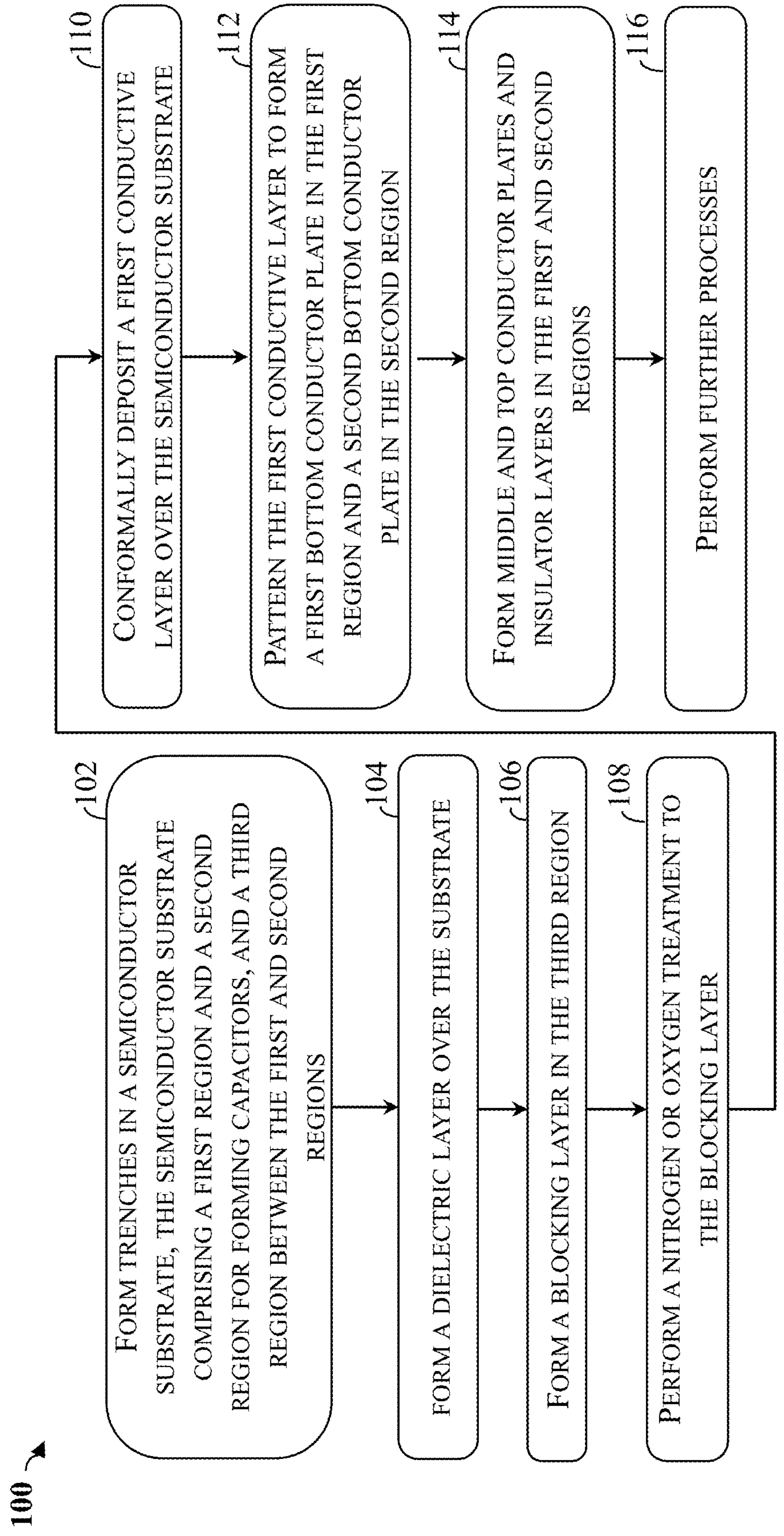
FIG. 1 is a flow chart of a method for fabricating a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Capacitors have been widely used in functional circuits such as mixed signal circuits, analog circuits, Radio Frequency (RF) circuits, Dynamic Random-Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. An metal-insulator-metal (MIM) capacitor includes a sandwich structure of interleaving metal layers and insulator layers. An example MIM capacitor includes multiple conductor plates, each of which is insulated from an adjacent conductor plate by an insulator layer. In order to increase the capacitance of MIM capacitor or planar capacitor, deep trench capacitor (DTC) has been developed. However, as semiconductor devices continue to scale down, challenges arise in achieving desired density and performance. For example, densely spaced capacitors with unsatisfactory electrical isolation therebetween may lead to leakage current, thereby disadvantageously affecting the performance of the capacitors. In some other situations, capacitors may be implemented in some applications that require different capacitances.

The present disclosure provides a method of providing a flexible configuration to the electrical connection between two adjacent trench capacitors. In an embodiment, after forming trenches in a semiconductor substrate, a blocking layer is formed in a region which is between two to-be-formed trench capacitors. After forming the blocking layer, a first trench capacitor is formed on one side of the blocking layer, and a second trench capacitor is formed on an opposite side of the blocking layer. That is, the first trench capacitor and the second trench capacitor are separated by the blocking layer. In an embodiment, a composition of the blocking layer may include TiN, TaN, MoN, RuN, CoN or other suitable materials. To provide an increased capacitance, under a first configuration, conductor plates of the first trench capacitor and conductor plates of the second trench capacitor are electrically coupled by the blocking layer. To provide an increased isolation, under a second configuration, an oxygen or nitrogen treatment may be performed to the blocking layer to increase a resistance of the blocking layer. Thus, the first trench capacitor may be electrically isolated from the second trench capacitor by the blocking layer. In some alternative embodiments, the blocking layer may include high-k dielectric materials to provide the satisfactory isolation between the first and second trench capacitors. By providing the blocking layer, semiconductor structure that includes the trench capacitors may be configured to satisfy different design requirements.

The various aspects of the present disclosure will now be described in more detail with reference to the figures. In that regard, FIG. 1 is a flowchart illustrating a method 100 for fabricating a semiconductor structure, according to embodiments of the present disclosure. Method 100 is described below in conjunction with FIGS. 2, 3, 4A-6A, 4B-6B, 7, 8A-9A, 8B-9B, 10, 11A-12A, 11B-12B, 13-14, 15A-17A, 15B-17B and 18, which are fragmentary perspective views, fragmentary top views, and/or fragmentary cross-sectional views of a workpiece at different stages of fabrication according to embodiments of method 100. Because the workpiece 200/200"/200'" will be fabricated into a semiconductor structure 200/200"/200'" at the conclusion of the fabrication processes, the workpiece 200/200"/200'" may also be referred to as a semiconductor structure 200/200"/200'" as the context requires. Method 100 is merely an example and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Additionally, throughout the present application, like reference numerals denote like features, unless otherwise excepted.

Figure 2:
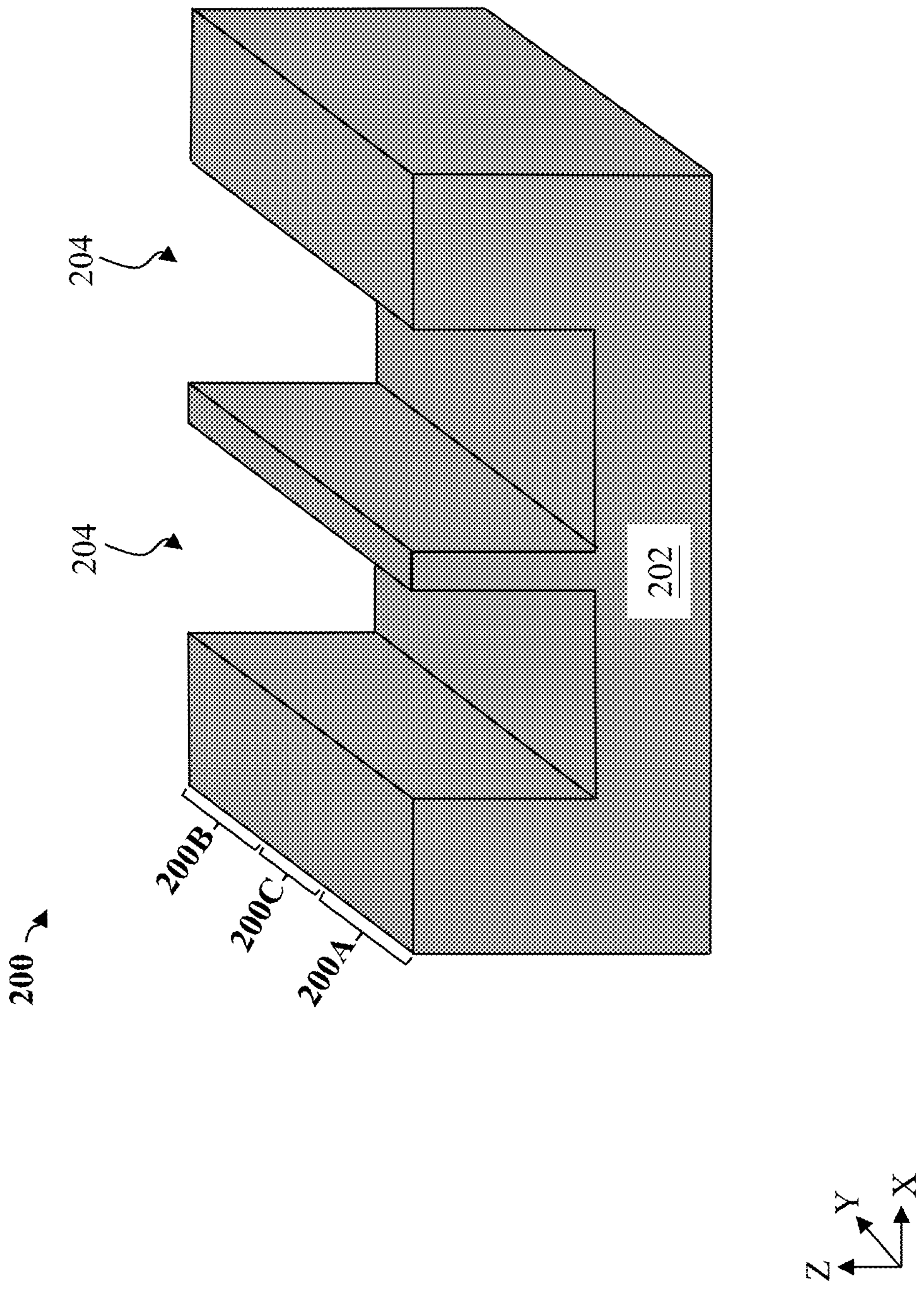
FIG. 2 is a fragmentary perspective view of an embodiment of a workpiece during various stages of operations in the method of FIG. 1, according to various aspects of the present disclosure.
Figure 3:
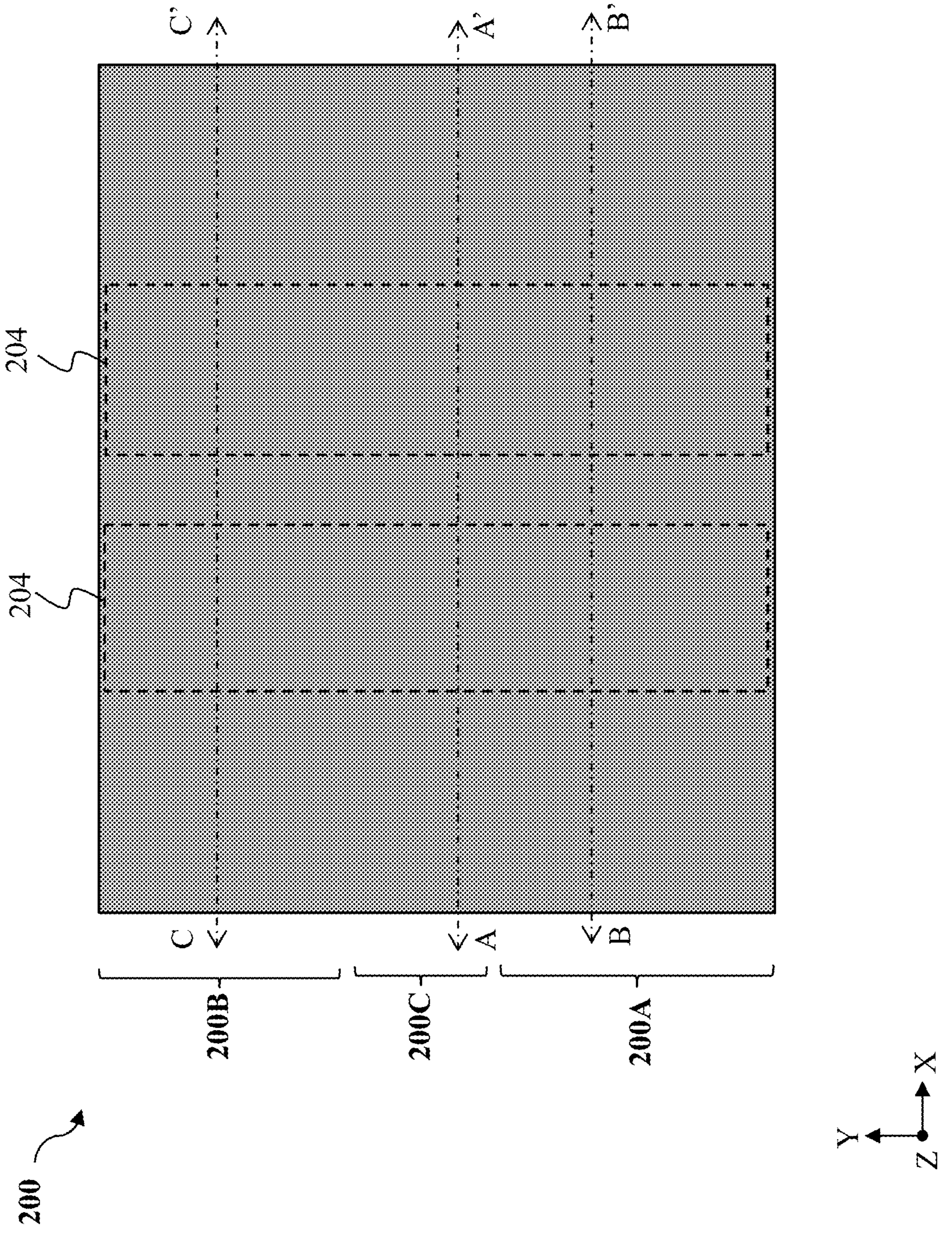
FIG. 3 is a fragmentary top view of the workpiece shown in FIG. 2, according to various aspects of the present disclosure.
Figure 4B:
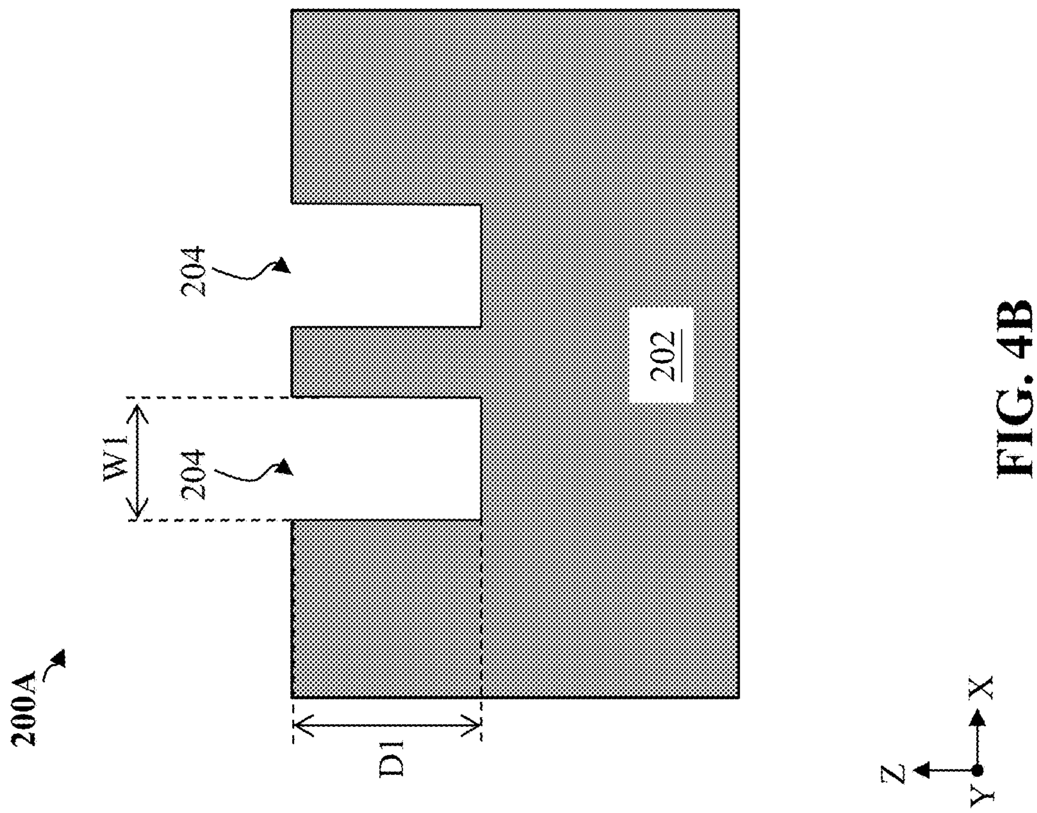
FIGS. 4B, 5B, 6B, 8B, 9B, 11B, 12B, 15B and 16B are fragmentary cross-sectional views of a workpiece taken along line B-B' as shown in FIG. 3 during various fabrication stages in the method of FIG. 1, according to various aspects of the present disclosure.
Figure 4A:
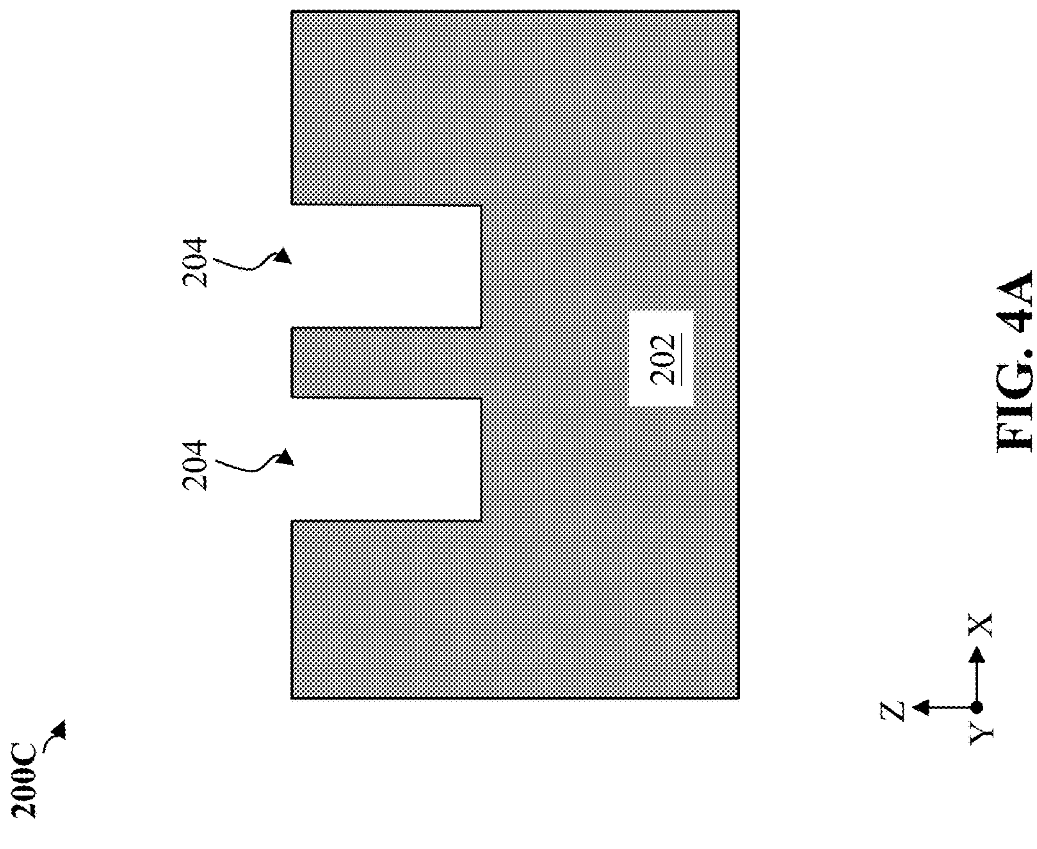
FIGS. 4A, 5A, 6A, 8A, 9A, 11A, 12A, 15A and 16A are fragmentary cross-sectional views of a workpiece taken along line A-A' as shown in FIG. 3 during various fabrication stages in the method of FIG. 1, according to various aspects of the present disclosure.

Referring to FIGS. 1, 2, 3, 4A and 4B, method 100 includes a block 102 where a workpiece 200 that includes a number of trenches 204 formed in a substrate 202 is provided. FIG. 3 depicts a fragmentary top view of the workpiece 200 shown in FIG. 2, FIG. 4A depicts a fragmentary cross-sectional view of the workpiece 200 taken along line A-A' as shown in FIG. 3, and FIG. 4B depicts a fragmentary cross-sectional view of the workpiece 200 taken along line B-B' as shown in FIG. 3. In the present embodiments, a cross-sectional view of the workpiece 200 taken along line C-C' as shown in FIG. 3 is substantially similar to or the same as the cross-sectional view of the workpiece 200 taken along line B-B' as shown in FIG. 3 and is thus omitted in the following description for reason of simplicity. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. In some embodiments, the substrate 202 may include one or more doped regions formed beneath an upper surface of the substrate 202. In one embodiment, the doped region(s) may include an N-type doped region formed by implanting an N-type dopant into the substrate 202.

The workpiece 200 also includes a number of trenches (e.g., trenches 204) extending into the substrate 202. In embodiments represented in FIG. 3, a top view of the trenches extend lengthwise along the Y direction. The trenches 204 may be formed in the substrate 202 by any suitable process. In some implementations, a combination of deposition, lithography and/or etching processes are performed to define the trenches 204 illustrated in FIGS. 2-3 and 4A-4B. For example, forming the trenches 204 includes performing a lithography process to form a patterned resist layer over the substrate 202 and performing an etching process to transfer a pattern defined in the patterned resist layer to substrate 202. The lithography process can include forming a resist layer on substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 202 (or a material layer disposed over substrate 202) to form the trenches 204. The etching process can include a dry etching process (for example, a reactive ion etching (RIE) process), a wet etching process, other suitable etching process, or combinations thereof. After the etching process, the patterned resist layer is removed from substrate 202, for example, by a resist stripping process. Alternatively, the trenches 204 may be formed by a multiple patterning process, such as a double patterning lithography (DPL) process. The trench 204 spans a width W1 along the X direction and has a depth D1 along the Z direction. In an embodiment, the width W1 may be between about 0.2 um and about 0.5 um. The depth D1 may be between about 8 um and about 20 um.

In the depicted embodiments, the workpiece 200 includes a first region 200A for forming a first trench capacitor (e.g., first trench capacitor 220 shown in FIG. 13) therein and a second region 200B for forming a second trench capacitor (e.g., second trench capacitor 222 shown in FIG. 13) therein. The workpiece 200 also includes a third region 200C disposed between the first region 200A and the second region 200B. A blocking layer (e.g., the blocking layer 208) may be formed in the third region 200C to provide desired connection or isolation between the first trench capacitor and the second trench capacitor. In embodiments represented in FIG. 2, the third region 200C is adjacent the first region 200A along the Y direction, and the second region 200B is adjacent the third region along the Y direction. It is understood that the workpiece 200 may include more regions to form more trench capacitors and blocking layers between two adjacent trench capacitors.

Figure 5A:
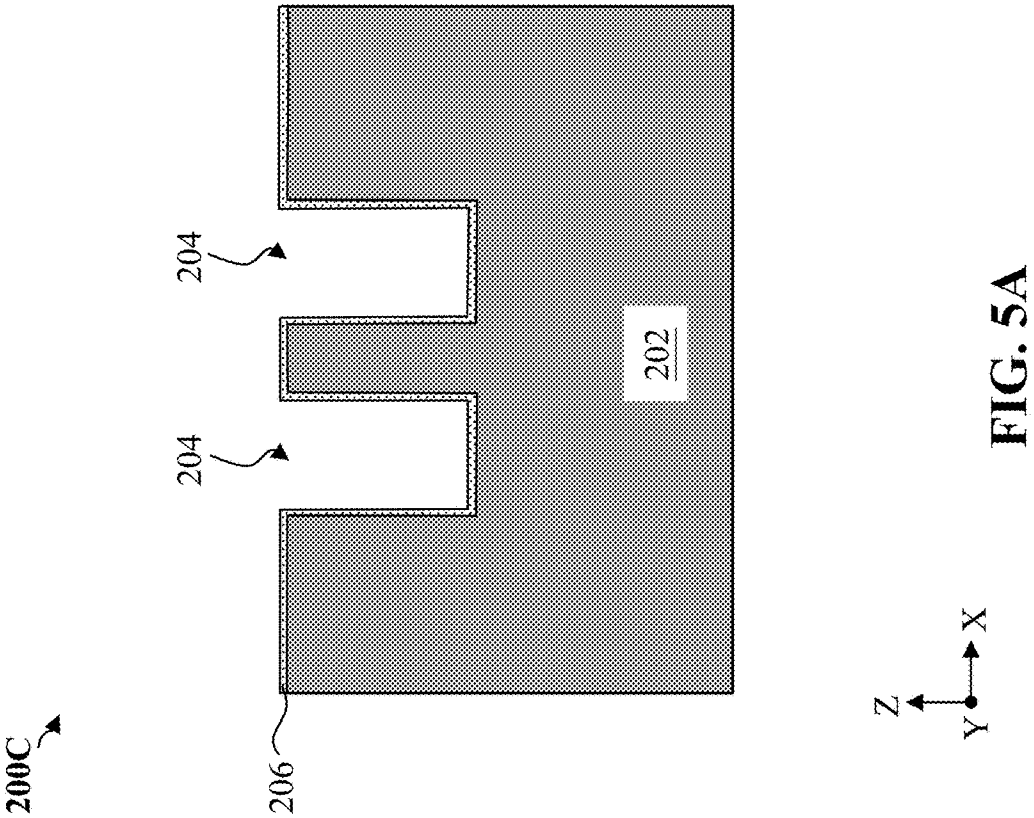
Figure 5B:
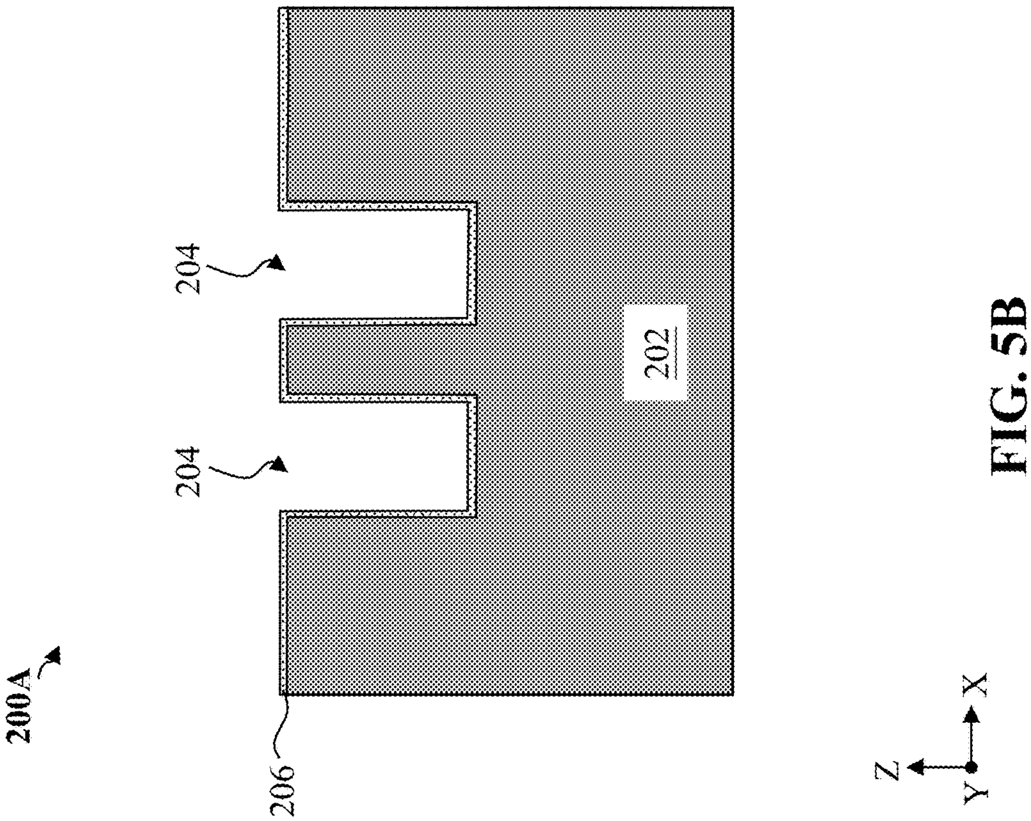
Figure 6A:
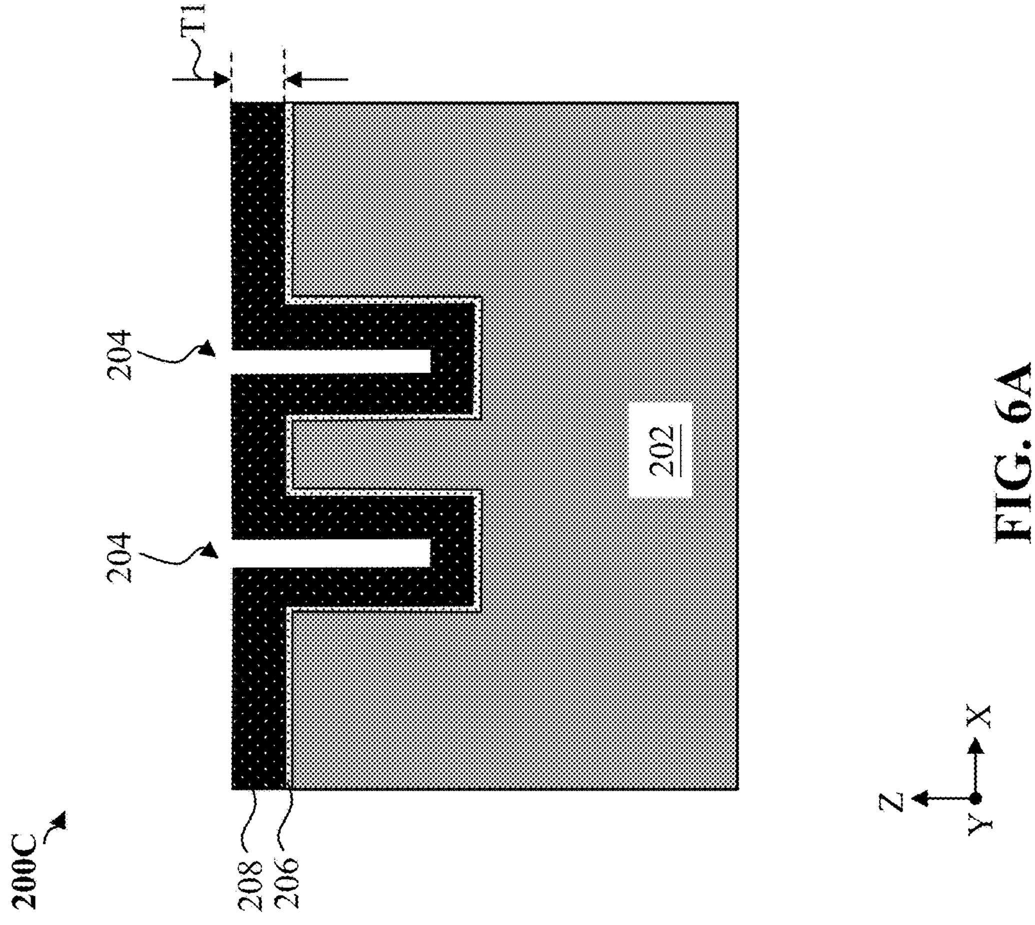
Figure 6B:
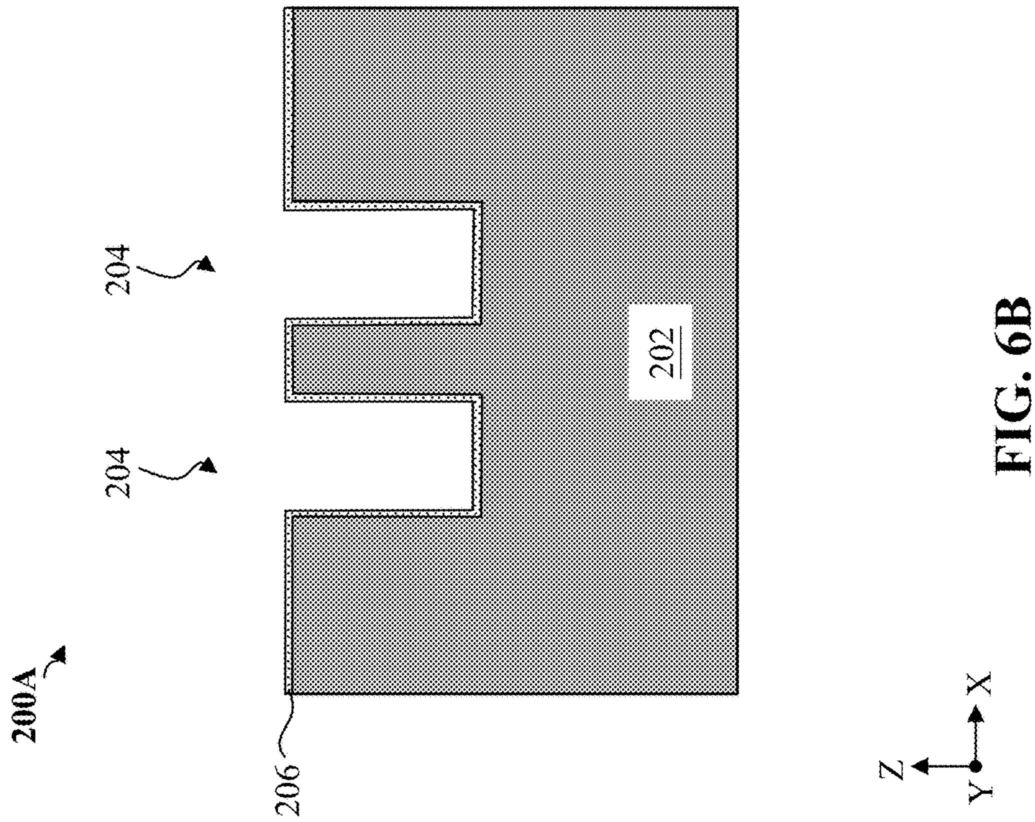

Referring to FIGS. 1, 5A and 5B, method 100 includes a block 104 where a dielectric liner 206 is formed over the substrate 202. The dielectric liner 206 is conformally formed on the substrate 202, including on an inner surface of the trenches 204 and an upper surface of the substrate 202. In the present embodiments, the dielectric liner 206 is formed in the first region 200A, the second region 200B, and the third region 200C. The dielectric liner 206 may be made of thermally grown material including silicon oxide or silicon nitride. The dielectric liner 206 may be deposited by chemical vapor deposition (CVD), such as plasma enhanced CVD (PECVD), low pressure CVD (LPCVD) or atmosphere pressure CVD (APCVD). In one embodiment, the dielectric liner 206 may be formed by a thermal oxidation process and may cover an entire top surface of the workpiece 200.

Figure 7:
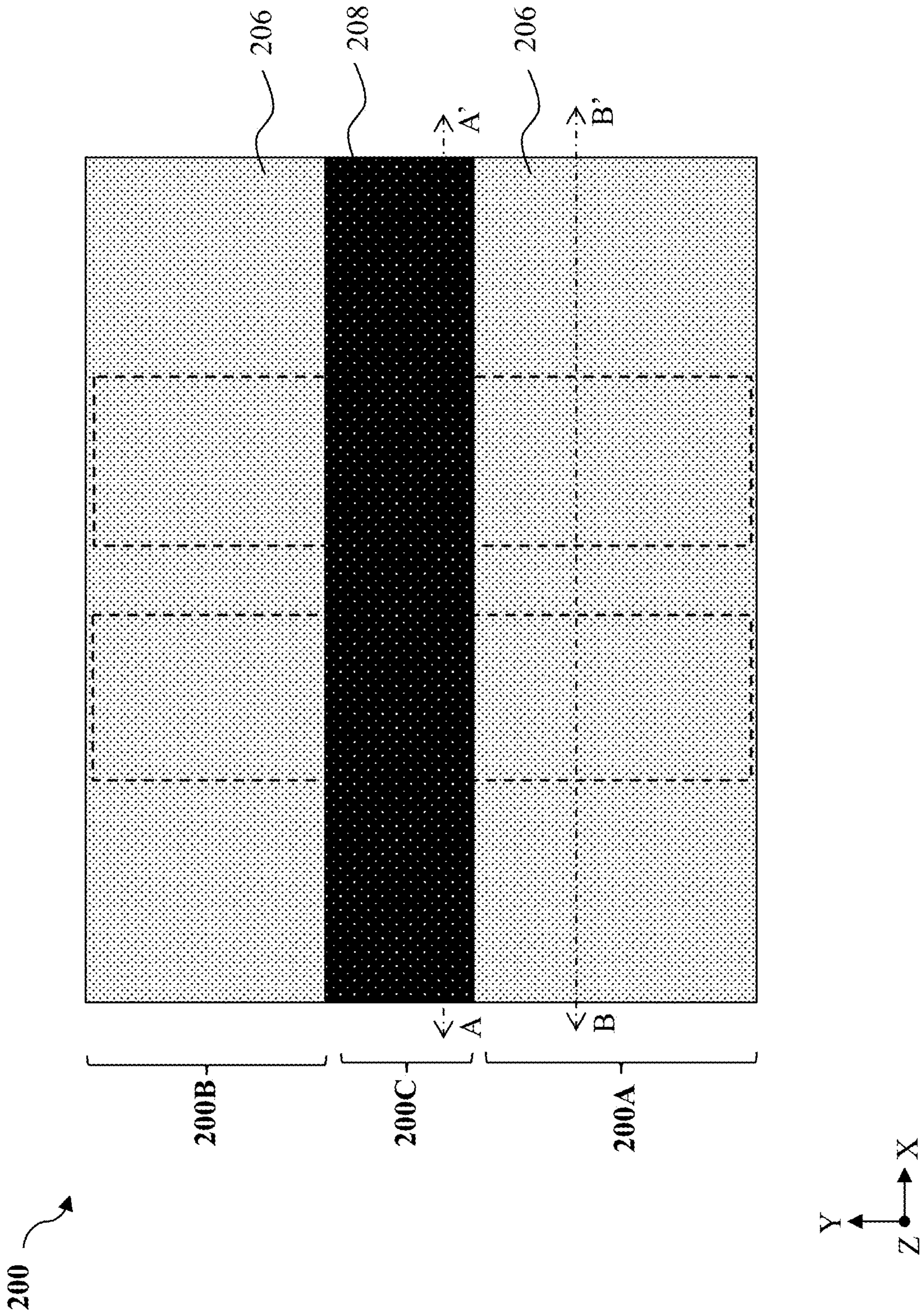
FIG. 7 is a fragmentary top view of the workpiece shown in FIGS. 6A and 6B, according to various aspects of the present disclosure.

Referring to FIGS. 1, 6A-6B and 7 method 100 includes a block 106 where a blocking layer 208 is formed in the third region 200C. In an embodiment, the formation of the blocking layer 208 includes conformally depositing a material layer over the substrate 202 and in the trenches 204 and patterning the material layer to form the blocking layer 208 in the third region 200C. That is, the blocking layer 208 is formed in the third region 200C without being formed in the first region 200A and the second region 200B. The material layer for forming the blocking layer 208 may be conformally deposited on the dielectric liner 206 using atomic layer deposition (ALD), chemical vapor deposition (CVD), or other suitable deposition processes and has a thickness T1. In the present embodiments, the blocking layer 208 covers an entirety of a portion of the dielectric liner 206 formed in the third region 200C. In other words, as indicated in FIG. 7 which illustrates a top view of the workpiece 200 shown in FIGS. 6A-6B, in a top view, boundary of the blocking layer 208 aligns with boundary of the third region 200C.

As semiconductor devices continue to scale down, challenges arise in achieving desired density and performance. For example, densely spaced trench capacitors may lead to leakage current, thereby disadvantageously affecting the performance of the capacitors. In some implementations, it's also challenging for trench capacitors with reduced dimensions to provide satisfactory large capacitances. In the present embodiments, by providing the blocking layer 208, the workpiece 200 may be configured to provide large capacitance or reduced leakage current to fulfill different design specifications. For example, in applications where a large capacitance is needed, the blocking layer 208 may include a conductive material such as metal or metal compound. In an embodiment, the blocking layer 208 includes titanium nitride (TiN), tantalum nitride (TaN), molybdenum nitride (MoN), cobalt nitride (CoN), ruthenium nitride (RuN), or other suitable materials. Thus, after forming the first trench capacitor in the first region 200A and the second capacitor in the second region 200B, conductor plates of the first and second trench capacitors may be electrically connected by the blocking layer 208, thereby providing an equivalent capacitor with an increased capacitance. In applications where a reduced leakage current is needed, the blocking layer 208 may be configured to have a high resistance or may be a high-k dielectric layer. For example, the blocking layer 208 may include hafnium oxide, zirconium oxide, titanium oxide, or other suitable materials.

Figure 8B:
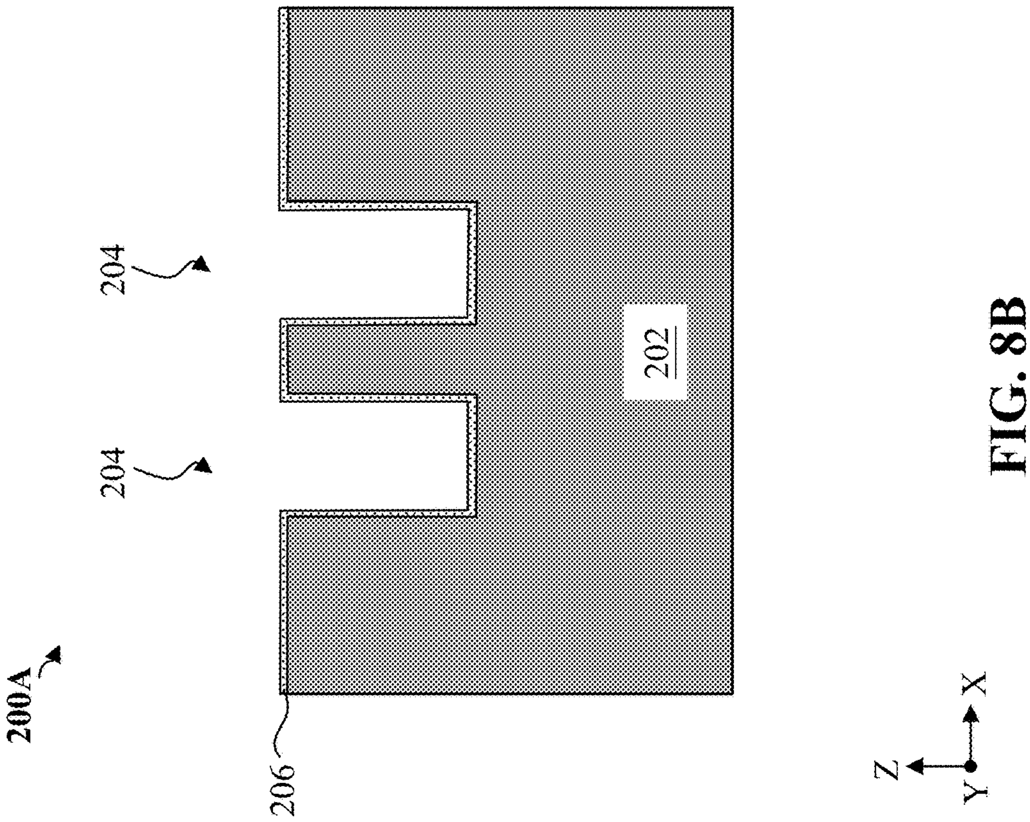
Figure 8A:
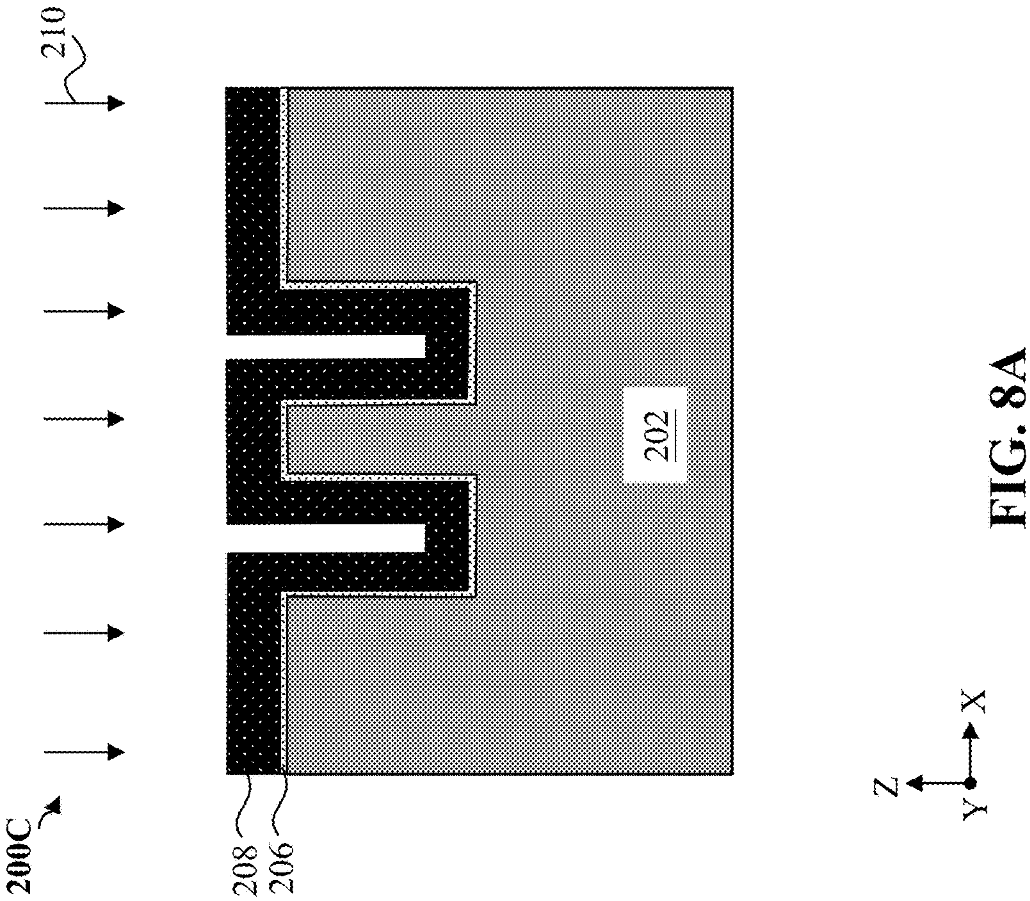

Referring to FIGS. 1, 8A and 8B, method 100 includes a block 108 where a treatment 210 is performed to the top surface of the blocking layer 208 in the third region 200C. In the present embodiments, the treatment 210 is performed to change a resistance of the blocking layer 208. The treatment 210 may include an oxygen treatment or a nitrogen treatment. In embodiments where the blocking layer 208 includes titanium nitride (TiN), tantalum nitride (TaN), molybdenum nitride (MoN), cobalt nitride (CoN), ruthenium nitride (RuN), and the workpiece 200 is configured to have a reduced leakage current, the treatment 210 may be a nitrogen treatment configured to increase nitrogen atomic concentration in a top portion of the blocking layer 208. A nitrogen atomic concentration may gradually decrease from a maximum level at the top surface of the blocking layer 208 to substantially stable level at the lower portion of the blocking layer 208. In an exemplary process, the nitrogen treatment is performed in a furnace under a temperature of about 700° C. to about 1000° C. for about 1 minute to about 10 minutes, using a source gas including, for example, nitrogen. Other suitable processes (e.g., plasma treatment) may be performed to increase nitrogen atomic concentration in the top portion of the blocking layer 208. The nitrogen treatment increases resistance of the blocking layer 208. Accordingly, the blocking layer 208 may also be referred to as a resistance adjustable structure 208. By optionally performing the treatment to the blocking layer 208, the trench capacitors that would be formed in the first and second regions 200A and 200B may be electrically coupled to provide an increased capacitance or electrically isolated by a high-resistance material.

In embodiments where the blocking layer 208 includes hafnium oxide, zirconium oxide, titanium oxide, or other suitable high-k dielectric materials, the treatment 210 may be an oxygen treatment configured to further increase oxygen atomic concentration in a top portion of the blocking layer 208 to increase the resistance of the blocking layer 208. An oxygen atomic concentration may gradually decrease from a maximum level at the top surface of the blocking layer 208 to substantially stable level at a lower portion of the blocking layer 208. In an exemplary process, the oxygen treatment is performed in a furnace under a temperature of about 700° C. to about 1000° C. for about 1 minute to about 10 minutes, using a source gas including, for example, $O_2$, $O_3$, or $H_2O$. Other suitable processes (e.g., plasma treatment) may be performed to increase oxygen atomic concentration in the top portion of the blocking layer 208. The oxygen treatment increases resistance of the blocking layer 208. Accordingly, the blocking layer 208 may also be referred to as an isolation structure 208. By performing the treatment to the high-k dielectric material-based blocking layer 208, the isolation between the trench capacitors that would be formed in the first and second regions 200A and 200B may be increased, thereby decreasing leakage current.

Figure 9A:
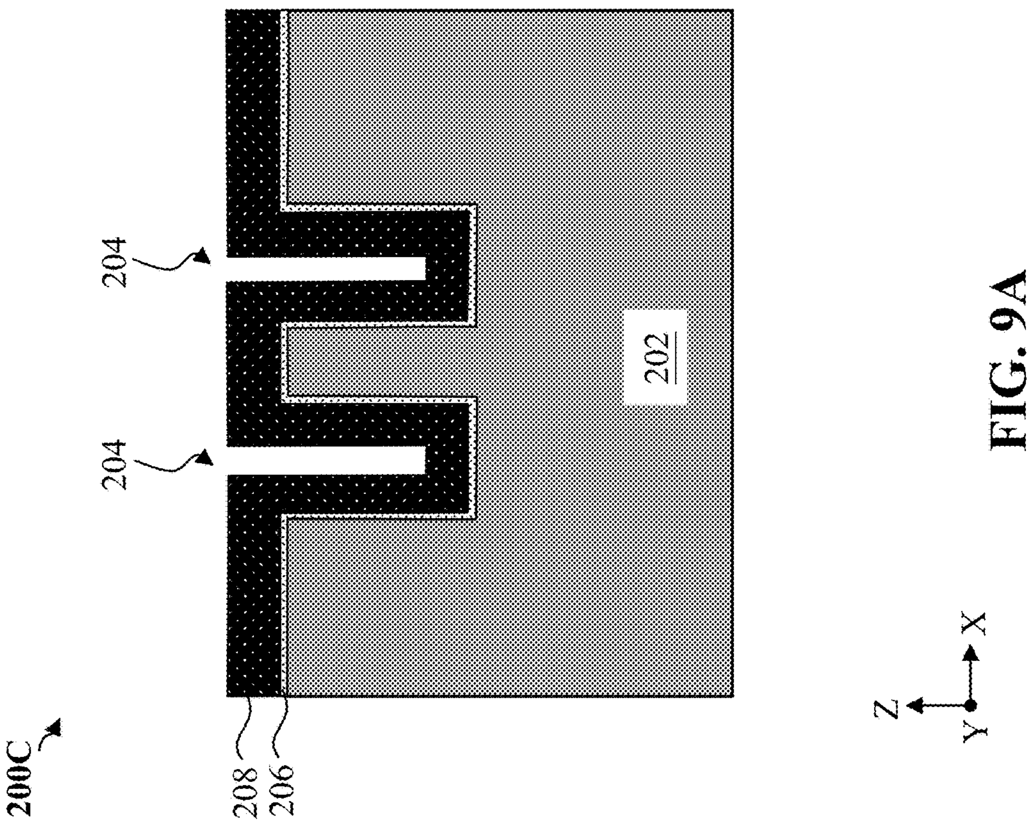
Figure 9B:
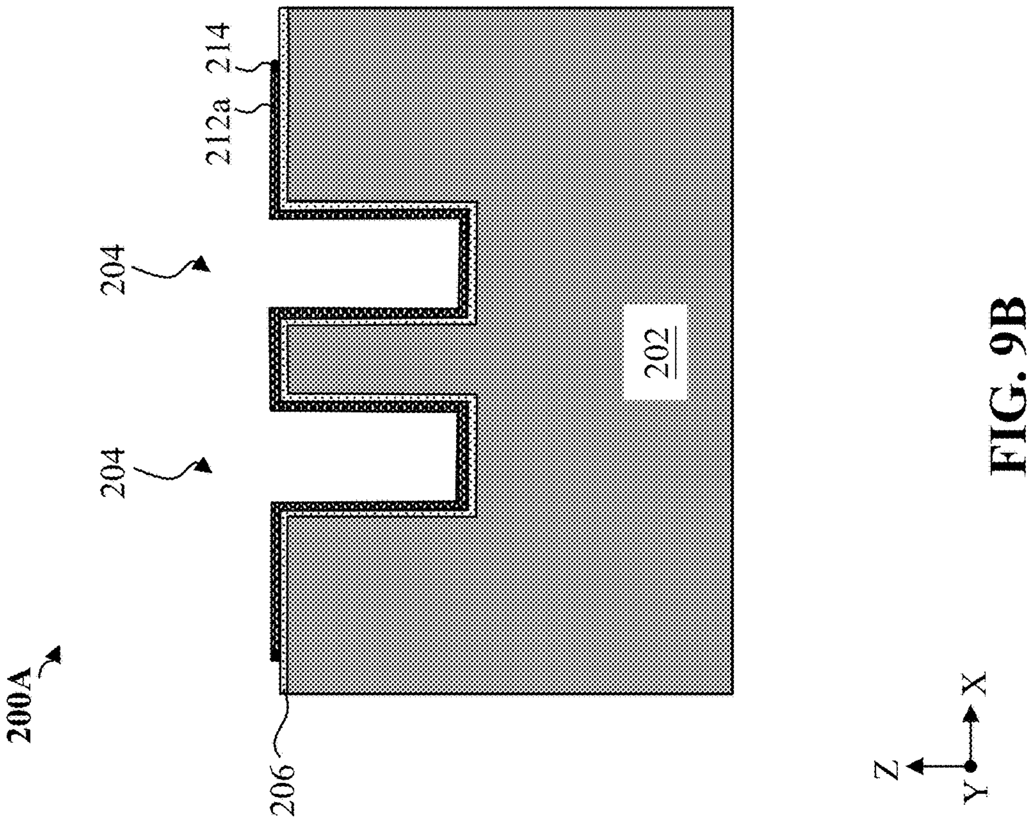
Figure 10:
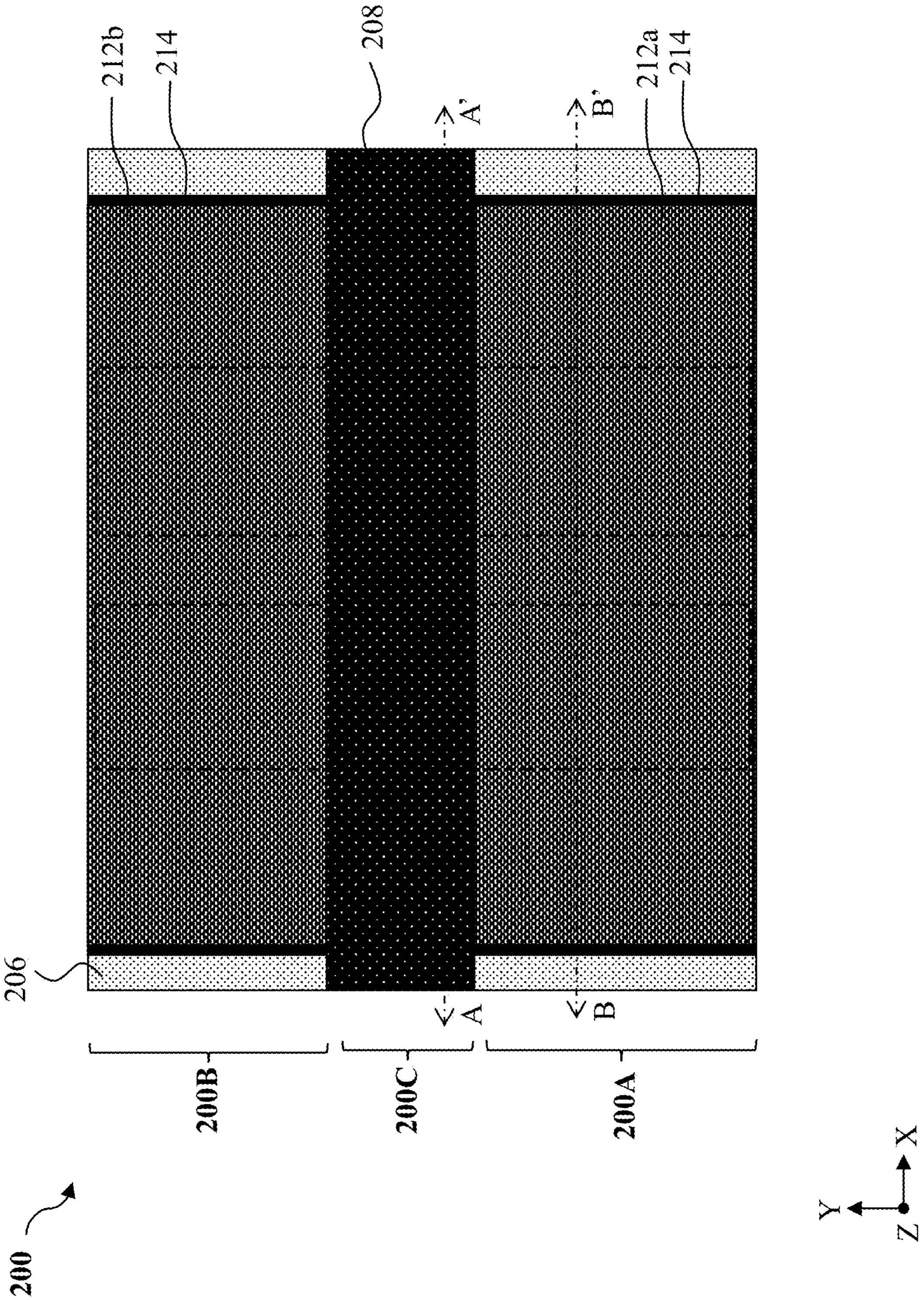
FIG. 10 is a fragmentary top view of the workpiece shown in FIGS. 9A and 9B, according to various aspects of the present disclosure.

Referring to FIGS. 1 and 9A-9B, method 100 includes a block 110 where a first conductive layer is conformally deposited over the substrate 202 and in the trenches 204. The first conductive layer may be deposited over the substrate 202 using ALD, physical vapor deposition (PVD), CVD, or other suitable deposition processes. In some embodiments, the first conductive layer may include titanium (Ti), tantalum (Ta), titanium nitride (TiN), tantalum nitride (TaN), copper (Cu), cobalt (Co), nickel (Ni), tungsten (W), aluminum (Al), or other suitable materials. The first conductive layer may cover an entire top surface of the workpiece 200.

Referring to FIGS. 1, 9A-9B and 10, method 100 includes a block 112 where the first conductive layer is patterned to form a bottom conductor plate 212*a* in the first region 200A and a bottom conductor plate 212*b* (also shown in FIG. 13) in the second region 200B. The patterning may include depositing a hard mask layer over the first conductive layer, forming a photoresist layer over the hard mask layer, patterning the photoresist layer using photolithography, etching the hard mask layer using the patterned photoresist layer as an etch mask, and then etching the first conductive layer using the patterned hard mask as an etch mask. Since the bottom conductor plate 212*a* and the bottom conductor plate 212*b* are formed by patterning the first conductive layer, the bottom conductor plate 212*a* and the bottom conductor plate 212*b* are formed simultaneously and are formed of the same composition. In an embodiment, the first conductive layer includes titanium nitride (TiN) and the etching of the first conductive layer includes implementing a dry etch using halogen-containing gas(es) (e.g., HCl, HF) as etchant. After the etching of the first conductive layer, a spacer layer 214 may be formed along sidewalls of the bottom conductor plates 212*a* and 212*b* due to chemical reaction between titanium nitride and the etchant. In some embodiments, the spacer layer includes metal halides.

Figure 11B:
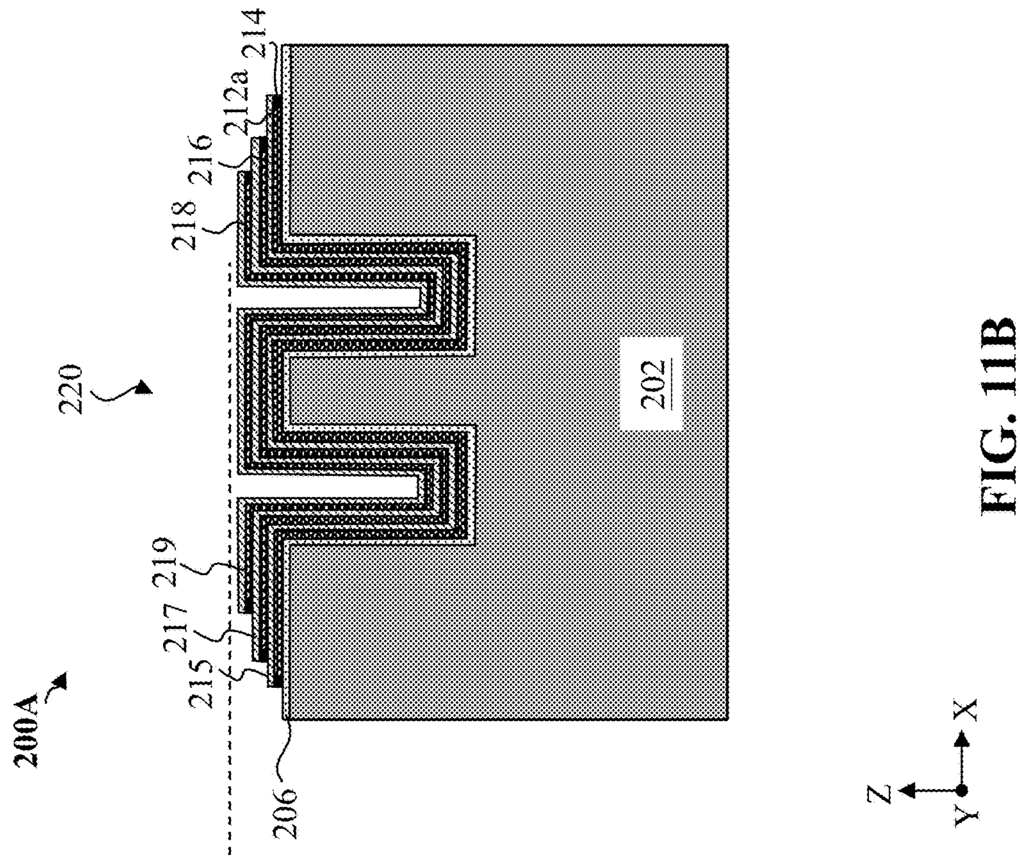
Figure 11A:
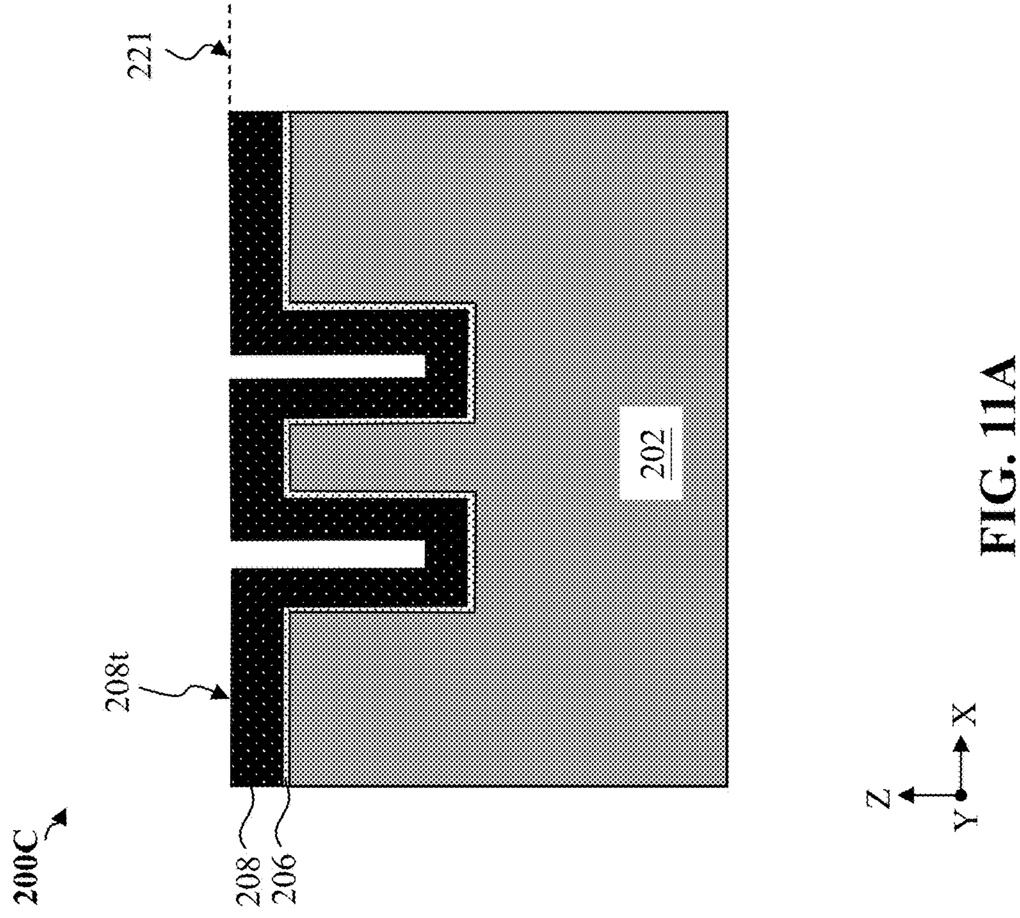

Referring to FIGS. 1, 11A and 11B, method 100 includes a block 114 where insulator layers and other conductive layers are deposited and patterned to form a first trench capacitor 220 in the first region 200A and a second trench capacitor 222 in the second region 200B. In the present embodiments, the second trench capacitor 222 formed in the second region 200B is formed along with the formation of the first trench capacitor 220 formed in the first region 200A and has same compositions and structure as those of the first trench capacitor. Thus, detailed description of the second trench capacitor 222 is omitted for reason of simplicity. In embodiments represented in FIG. 11B, a first insulator layer 215 is formed in the bottom conductor plate 212*a* in the first region 200A. The formation of the first insulator layer 215 may include conformally depositing a first dielectric layer over the workpiece 200 and then patterning the first dielectric layer to form the first insulator layer 215 in the first region 200A. In an embodiment, the first dielectric layer is conformally deposited to have a generally uniform thickness over the top surface of the workpiece 200 (e.g., having about the same thickness on top and sidewall surfaces of the bottom conductor plate 212*a*). It is understood that, in some embodiments, the patterning of the first dielectric layer further forms a corresponding insulator layer (not shown) on the bottom conductor plate 212*b* in the second region 200B. The first dielectric layer may be deposited using CVD, ALD, or a suitable deposition method and may be a high-k dielectric layer that includes hafnium oxide, aluminum oxide, zirconium oxide, titanium oxide, tantalum oxide, or a combination thereof. In an embodiment, the first insulator layer 215 includes hafnium oxide, and the blocking layer 208 also includes hafnium oxide, and due to the oxygen treatment applied to the blocking layer 208, an average oxygen atomic concentration in the blocking layer 208 is greater than an average oxygen atomic concentration in the first insulator layer 215.

Still referring to FIG. 11B, after forming the first insulator layer 215 on the bottom conductor plate 212*a*, a middle conductor plate 216, a second insulator layer 217, a top conductor plate 218, and a third insulator layer 219 are sequentially formed over the first insulator layer 215 to finish the fabrication of the first trench capacitor 220 in the trenches 204 and over the substrate 202 in the first region 200A. The fabrication processes and compositions of the second insulator layer 217 and/or the third insulator layer 219 may be similar to those of the first insulator layer 215. The fabrication processes and compositions of the middle conductor plate 216 and/or the top conductor plate 218 may be similar to those of the bottom conductor plate 212*a*. In the present embodiments, the first trench capacitor 220 includes the bottom conductor plate 212*a*, the first insulator layer 215 formed on the bottom conductor plate 212*a*, the middle conductor plate 216 formed on the first insulator layer 215, the second insulator layer 217 formed on the middle conductor plate 216, the top conductor plate 218 formed on the second insulator layer 217, and the third insulator layer 219 formed on the top conductor plate 218. As described above, the formation of the middle conductor plate 216 and/or the top conductor plate 218 may also form spacer layers extending along sidewall surfaces of the middle conductor plate 216 and/or the top conductor plate 218. In the present embodiment, to provide a better connection or a better isolation, the deposition thickness T1 of the blocking layer 208 is configured such that a top surface of the first trench capacitor 220 is below a top surface 208*t* of the blocking layer 208. In other words, a total thickness of the insulator layers and conductor plates of first trench capacitor 220 is less than the deposition thickness T1 of the blocking layer 208, as indicated by a dashed line 221. It is understood that the structure of the first trench capacitor 220 depicted in FIG. 11B is just an example, and the first trench capacitor 220 may include any suitable number of conductor plates. Adjacent conductor plates are insulated from one another by an insulator layer.

Figure 12B:
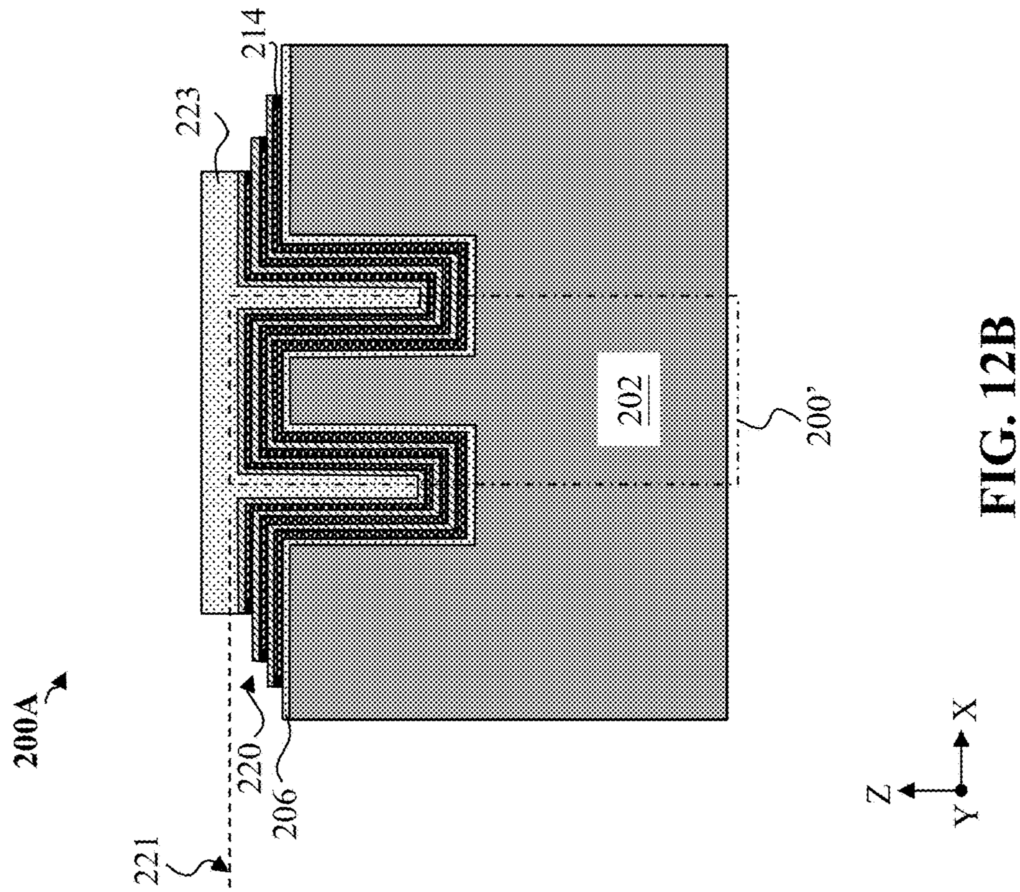
Figure 12A:
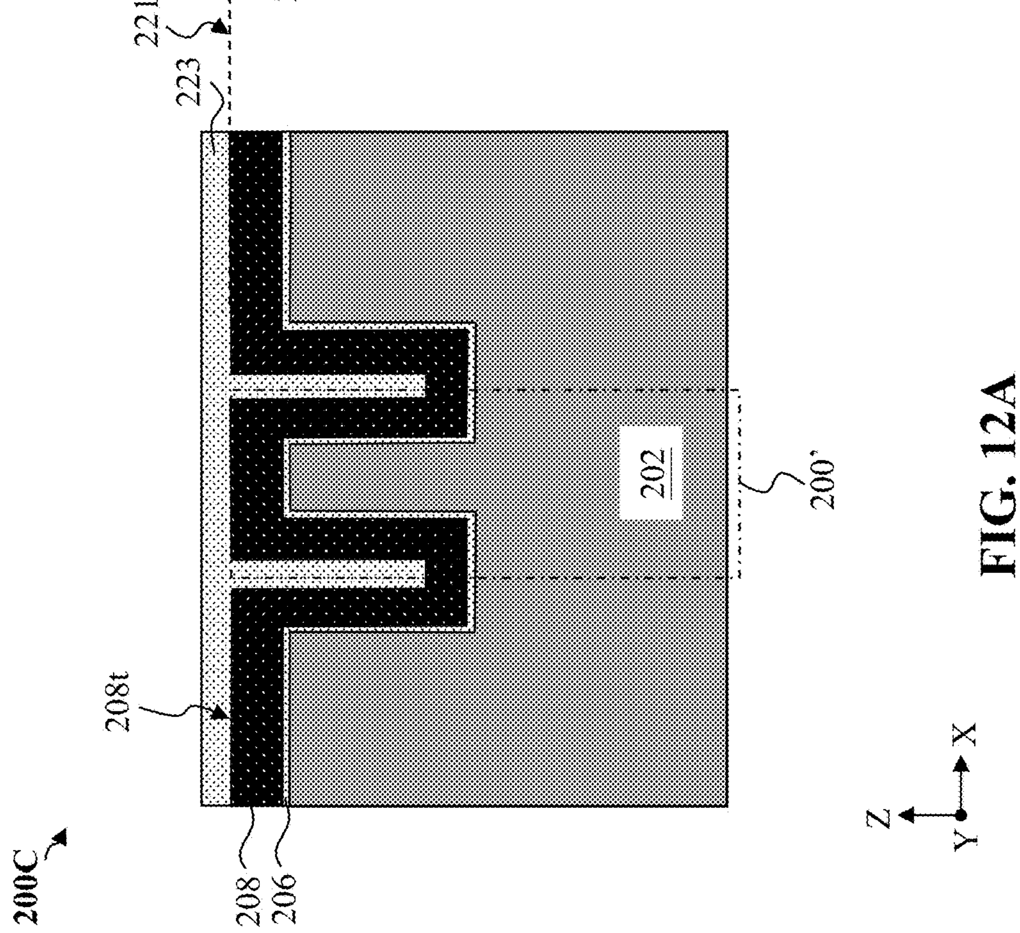

Referring to FIGS. 1, 12A-12B, 13-14, 15A-15B and 16A-16B, method 100 includes a block 116 where further processes are performed to finish the fabrication of the semiconductor structure. For example, as illustrated in FIGS. 12A and 12B, after the formation of the first trench capacitor 220, a dielectric layer 223 is formed to fill remaining portions of the trenches 204. The dielectric layer 223 may be deposited using a suitable deposition technique, such as ALD, PVD or CVD. The dielectric layer 223 may include an oxide such as silicon oxide, a nitride such as a silicon nitride, a combination thereof, a multilayer thereof, or the like. In an embodiment, the dielectric layer 223 includes silicon oxide. A planarization process (e.g., chemical mechanical polishing (CMP)) may be performed after the deposition of the dielectric layer. In some embodiments, after the planarization process, the dielectric layer 223 may be patterned to remove portions of the dielectric layer 223 extending beyond the spacer layers 214.

Figure 13:
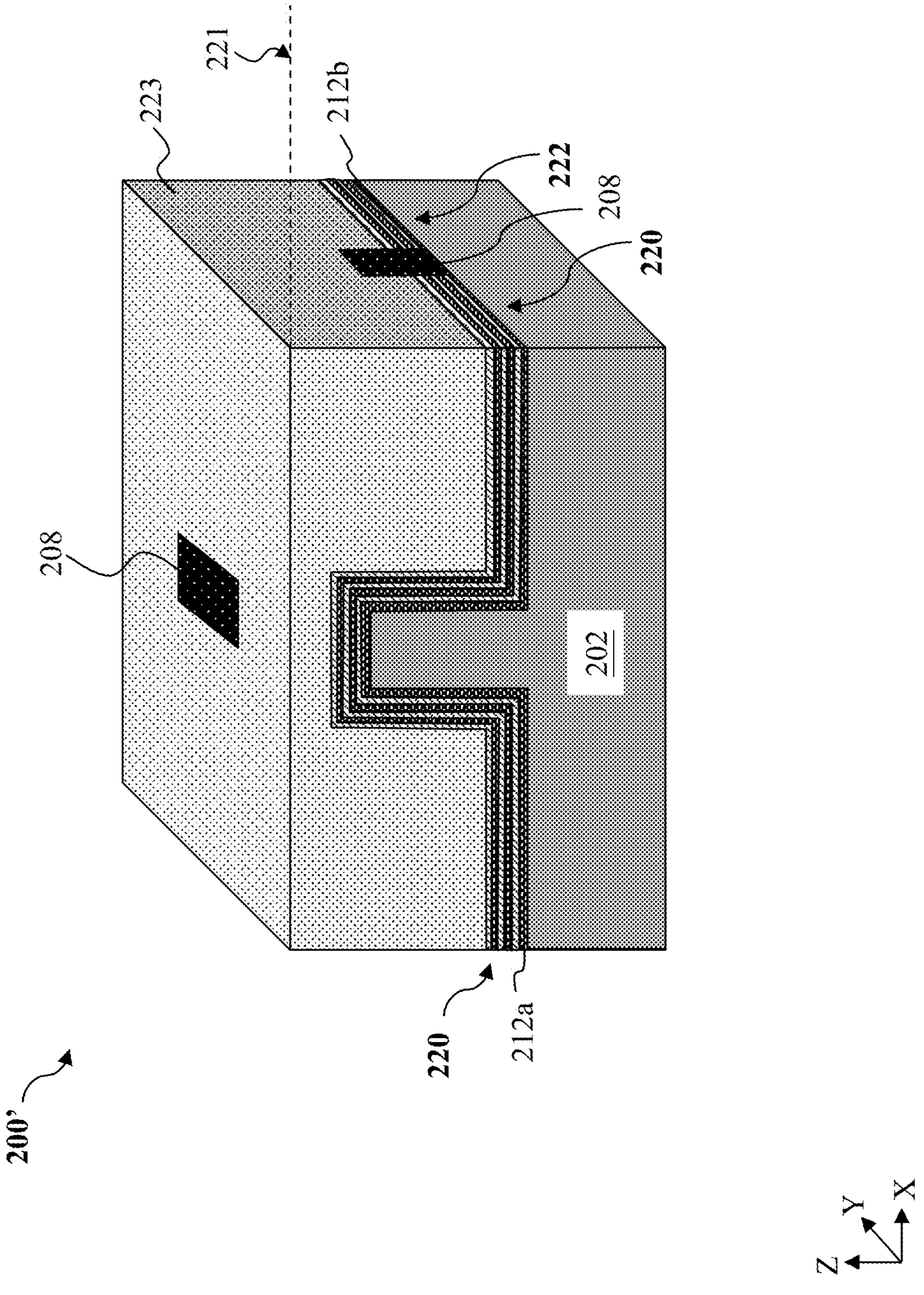
FIG. 13 is a fragmentary perspective view of a portion of the workpiece shown in FIGS. 12A and 12B, according to various aspects of the present disclosure.
Figure 14:
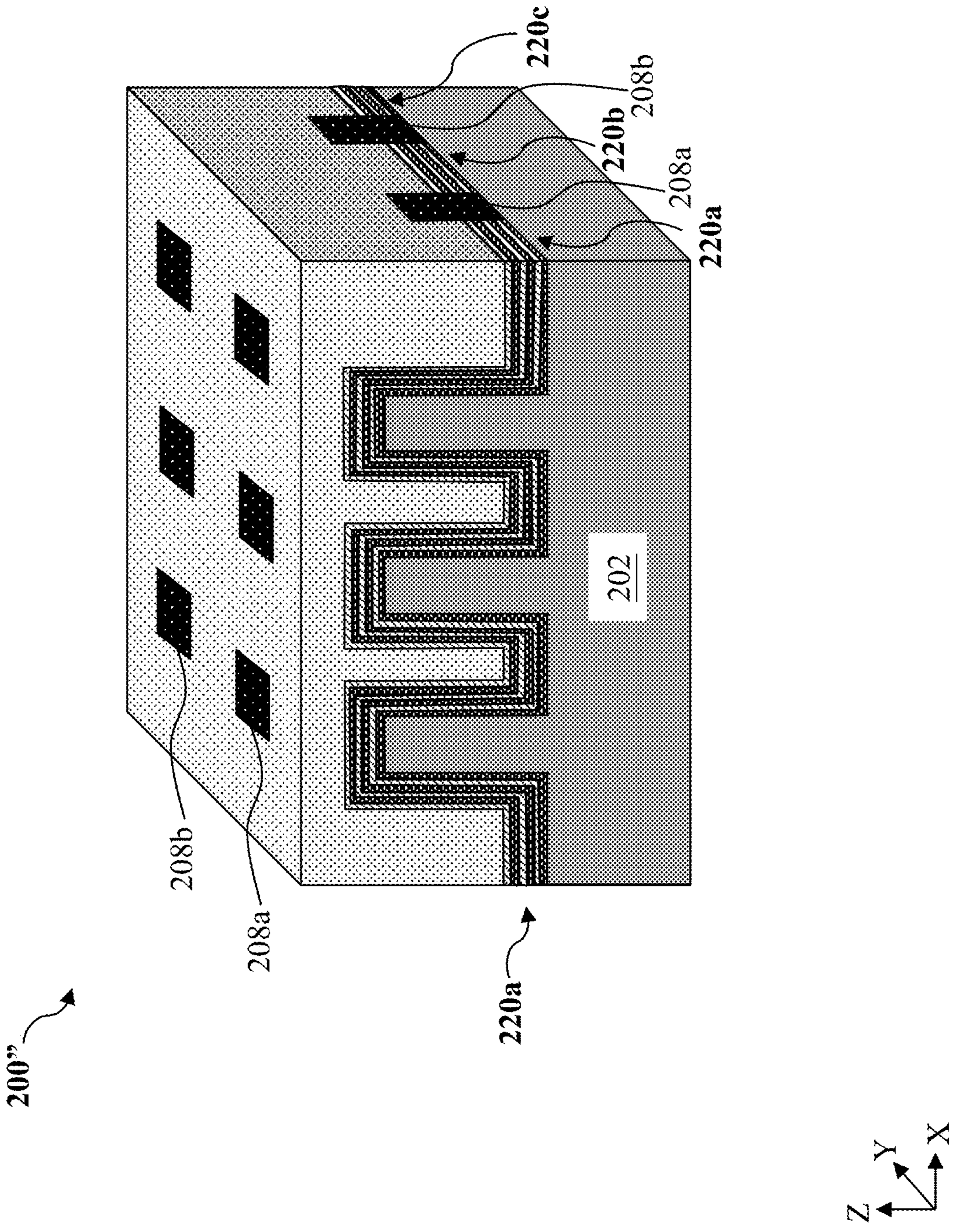
FIG. 14 is a fragmentary perspective view of a portion of an alternative workpiece, according to various aspects of the present disclosure.

FIG. 13 depicts a fragmentary perspective view of a portion 200' of the workpiece 200 shown in FIGS. 12A and 12B. As illustrated in FIG. 13, the top surface 208*t* of the blocking layer 208 is above a top surface of the first trench capacitor 220 and above a top surface of the second trench capacitor 222. Along the Y direction, the first trench capacitor 220 and the second trench capacitor 222 are in direct contact with the blocking layer 208 and separated by the blocking layer 208. In embodiments represented in FIG. 13, each of the conductor plates and insulator layers of the first trench capacitor 220 is in direct contact with the blocking layer 208, and each of the conductor plates and insulator layers of the second trench capacitor 222 is also in direct contact with the blocking layer 208. As described above, by adjusting the resistance of the blocking layer 208, the first trench capacitor 220 and the second trench capacitor 222 may be electrically connected or electrically isolated. Thus, the workpiece 200 may be implemented in various applications which require different capacitances.

In the above embodiments described with reference to FIGS. 2-13, the workpiece 200 includes two trench capacitors 220 and 222 and one blocking layer 208 disposed therebetween. In some other embodiments, for example, in embodiments represented in FIG. 14, a workpiece 200" may include more trench capacitors (e.g., trench capacitors 220*a*, 220*b*, 220*c*) and more blocking layers (e.g., blocking layers 208*a*, 208*b*). The trench capacitor 220*a* and 220*b* are spaced apart by the blocking layer 208*a* and in direct contact with the blocking layer 208*a*, and the trench capacitor 220*b* and 220*c* are spaced apart by the blocking layer 208*b* and in direct contact with the blocking layer 208*b*. In some embodiments, the blocking layer 208*a* and 208*b* may have same or different compositions, depending on the desired performance. For example, the blocking layer 208*a* may include TiN and no oxygen/nitrogen treatment is performed to increase the resistance of the blocking layer 208*a*, and the blocking layer 208*b* may include $HfO_2$ and oxygen treatment is performed to increase the resistance of the blocking layer 208*b*. Thus, the trench capacitor 220*a* and the trench capacitor 220*b* are electrically connected by the blocking layer 208*a* to provide an increased capacitance, and the trench capacitor 220*b* and the trench capacitor 220*c* are electrically isolated by the blocking layer 208*b*.

Figure 15B:
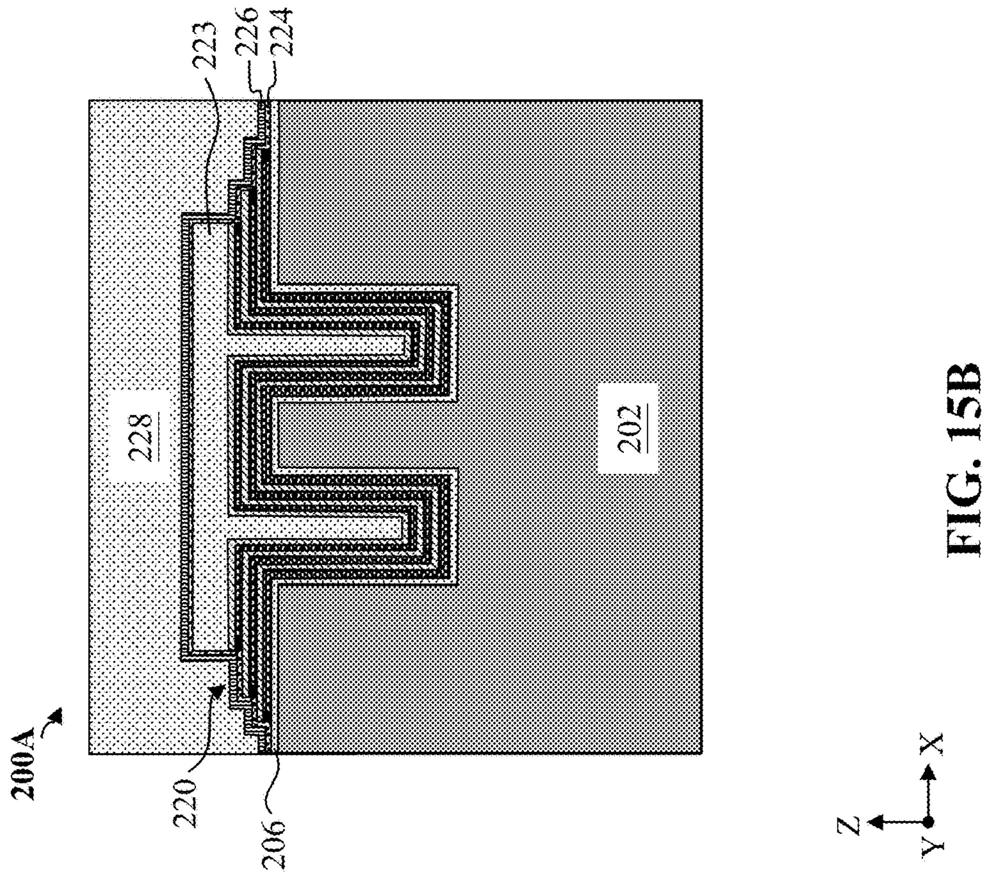
Figure 15A:
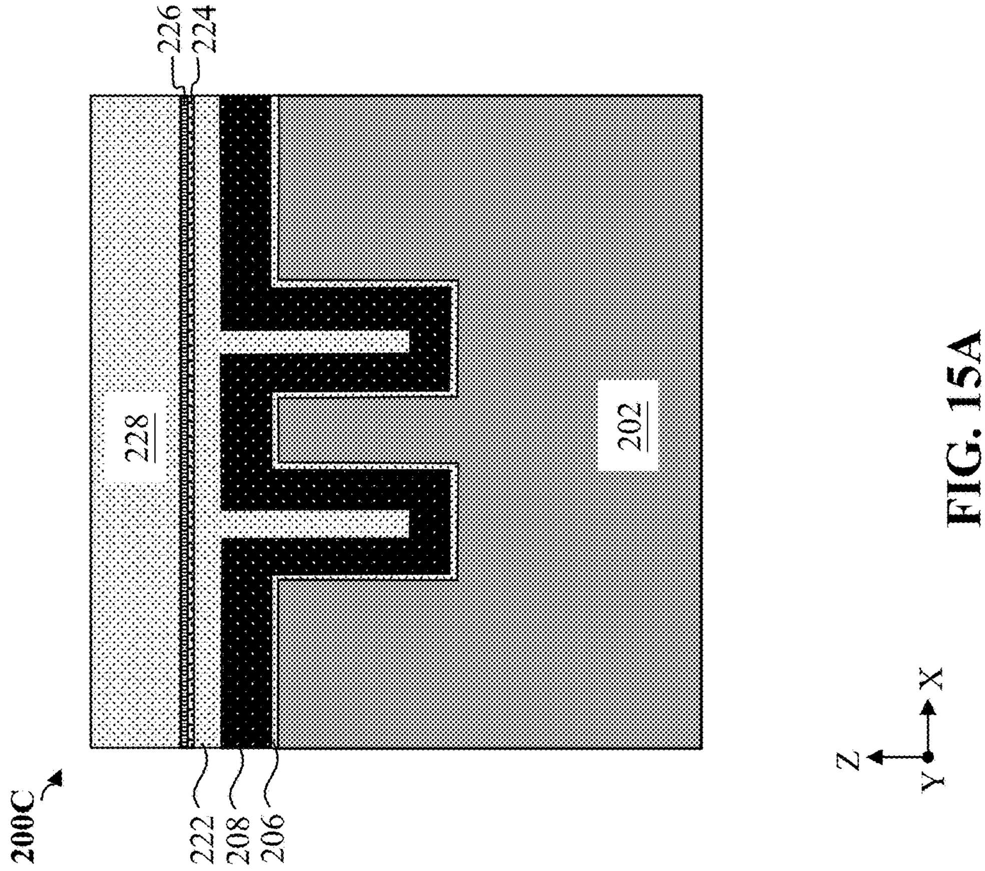

After forming and patterning the dielectric layer 223, as illustrated in FIGS. 15A and 15B, a dielectric material 224 may be conformally formed over the workpiece 200. Any suitable deposition process may be used, including CVD, PVD, ALD, or combinations thereof. In some embodiments, the dielectric material 224 includes undoped silicon oxide or undoped silicate glass (USG). In some embodiments, after forming the dielectric material 224, an etch stop layer (ESL) 226 is formed over the substrate 202. In some embodiments, the ESL 226 may include one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like. In some embodiments, the ESL 226 is used to aid in forming contact vias that provide electrical connection to the conductor plates of the trench capacitors 220 and 222. The ESL 226 may be also referred to as a contact etch stop layer (CESL).

Still referring to FIGS. 15A and 15B, after the formation of the ESL 226, an interlayer dielectric layer 228 is formed over the substrate 202. the interlayer dielectric layer 228 may include a low-k dielectric material such as phosphosilicate glass (PSG), borophosphosilicate glass (BPSG), fluorosilicate glass (FSG), silicon oxycarbide, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like.

Contact vias (such as contact vias 234*a*, 234*b*, 234*c*) may be then formed using any suitable methods. In some embodiments, the steps for forming the contact vias include forming a patterned mask film (e.g., the patterned mask film 230 and the patterned mask film 232), forming openings in the respective dielectric layers (e.g., 224, 226, 228), depositing one or more barrier/adhesion layers (not shown) in the openings, and filling the openings with a conductive material. A chemical mechanical polishing (CMP) is then performed to remove excess materials of the one or more barrier/adhesion layers, and the conductive material overfilling the openings. In an embodiment, the patterned mask film 230 includes silicon oxynitride, and the patterned mask film 232 includes oxide. The barrier layer may include titanium nitride (TiN), tantalum nitride (TaN), or another metal nitride. The conductive material filling layer may be formed of copper (Cu), aluminum (Al), or an alloy thereof. In the present embodiments, the contact via 234*a* is electrically coupled to the middle conductor plate 216, the contact via 234*b* is electrically coupled to the top conductor plate 218, and the contact via 234*c* is electrically coupled to the bottom conductor plate 212*a*.

After forming the contact vias 234*a*, 234*b*, 234*c*, further processes may be performed. Such further processes may include, for example, forming a dielectric layer on the contact vias 234*a*, 234*b*, 234*c*, patterning the dielectric layer to form a number of openings exposing the contact vias 234*a*, 234*b*, 234*c*, and forming metal lines in the openings. In some embodiments, the metal lines may be part of a redistribution layer (RDL) to reroute bond connections between upper and lower layers. Such further processes may also include formation of a passivation structure over the metal lines, formation of openings through the third passivation structure to expose the metal lines, deposition of one or more polymeric material layers, patterning of the one or more polymeric material layers, deposition of an under-bump-metallurgy (or under-bump-metallization (UBM)) layer, deposition of a copper-containing bump layer, deposition of a cap layer, deposition of a solder layer, and reflowing of the solder layer. These further processes form contact structures for connection to external circuitry.

In some embodiments, during the deposition of the dielectric layer 223, voids may be formed in the workpiece 200.

Figure 16B:
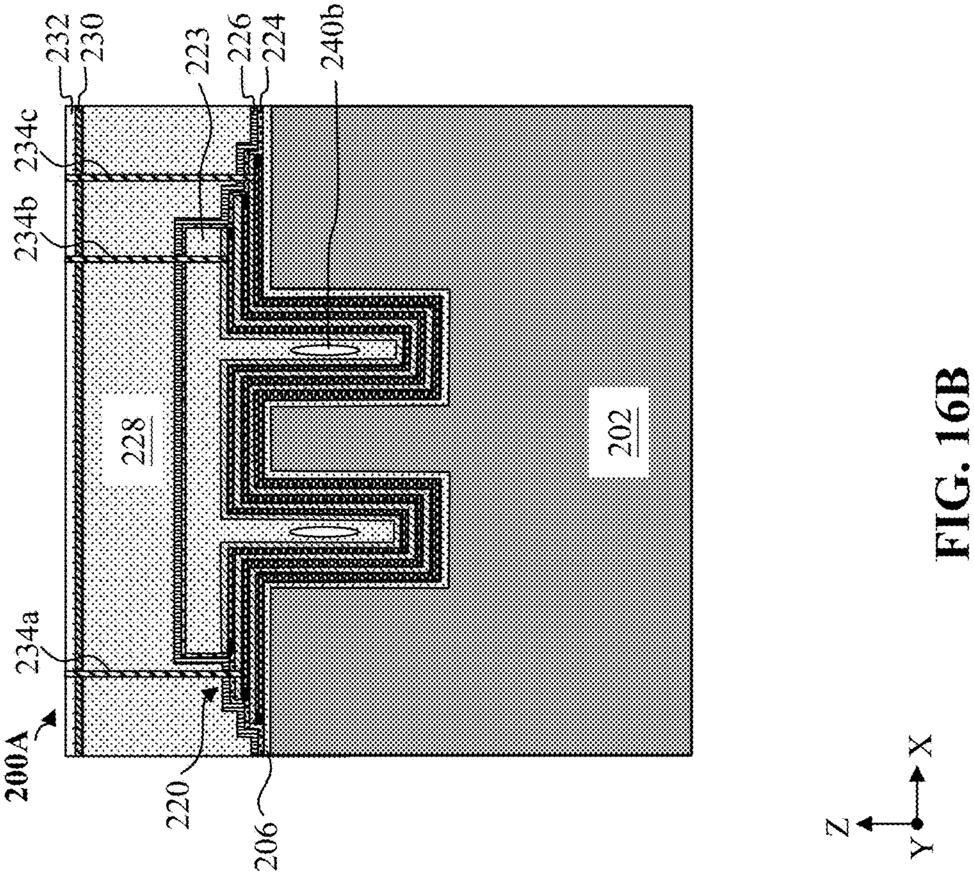
Figure 16A:
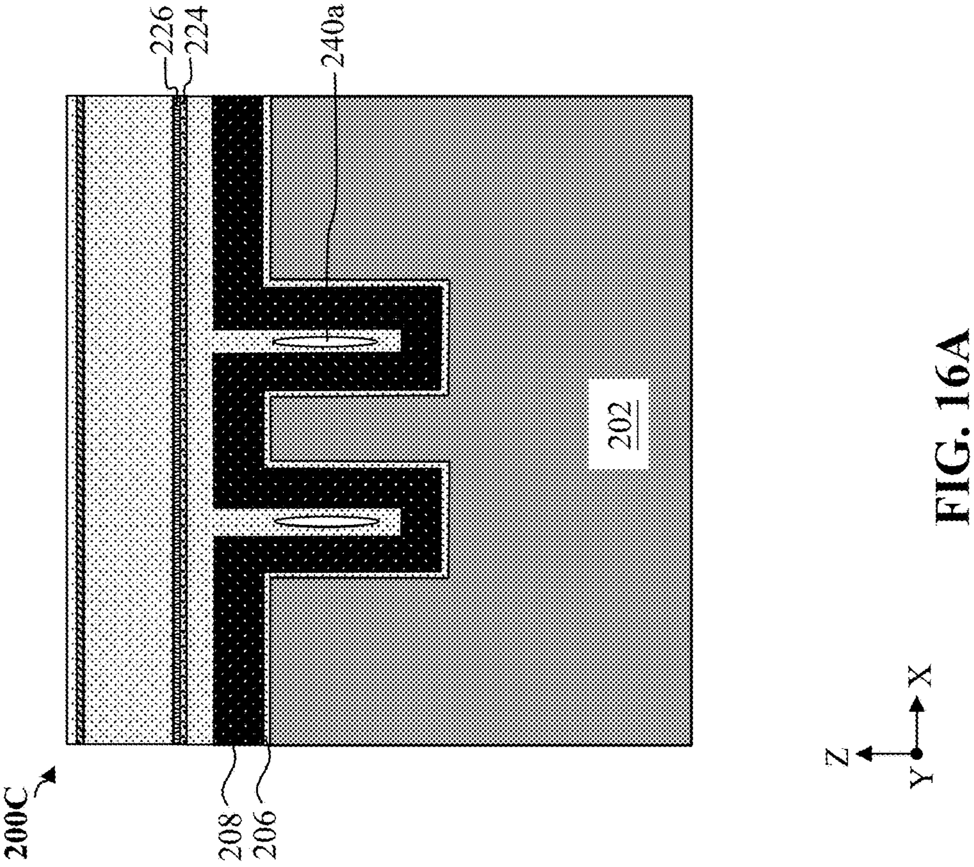

In embodiments represented in FIGS. 16A and 16B, the workpiece 200 includes voids 240*a* formed in the third region 200C and voids 240*b* formed in the first region 200A and/or the second region 200B. As described above, the deposition thickness T1 of the blocking layer 208 is greater than a total thickness of the conductor plates and insulator layers of the first trench capacitor 220. Thus, after forming the blocking layer and the first trench capacitor 220, an aspect ratio (i.e., a ratio of a height of an opening to a width of the opening) of a remaining portion of the trench 204 (i.e., a portion of the trench 204 not filled by the blocking layer 208) in the third region 200C is greater than an aspect ratio of a remaining portion of the trench 204 (i.e., a portion of the trench 204 not filled by the first trench capacitor 220) in the first region 200A. In some embodiments, since the aspect ratio associated with the third region 200C is greater than the aspect ratio associated with the first/second region 200A/200B, a volume of the void 240*a* formed in the third region 200C may be greater than a volume of the void 240*b* formed in the first/second region 200A/200B.

Figure 17B:
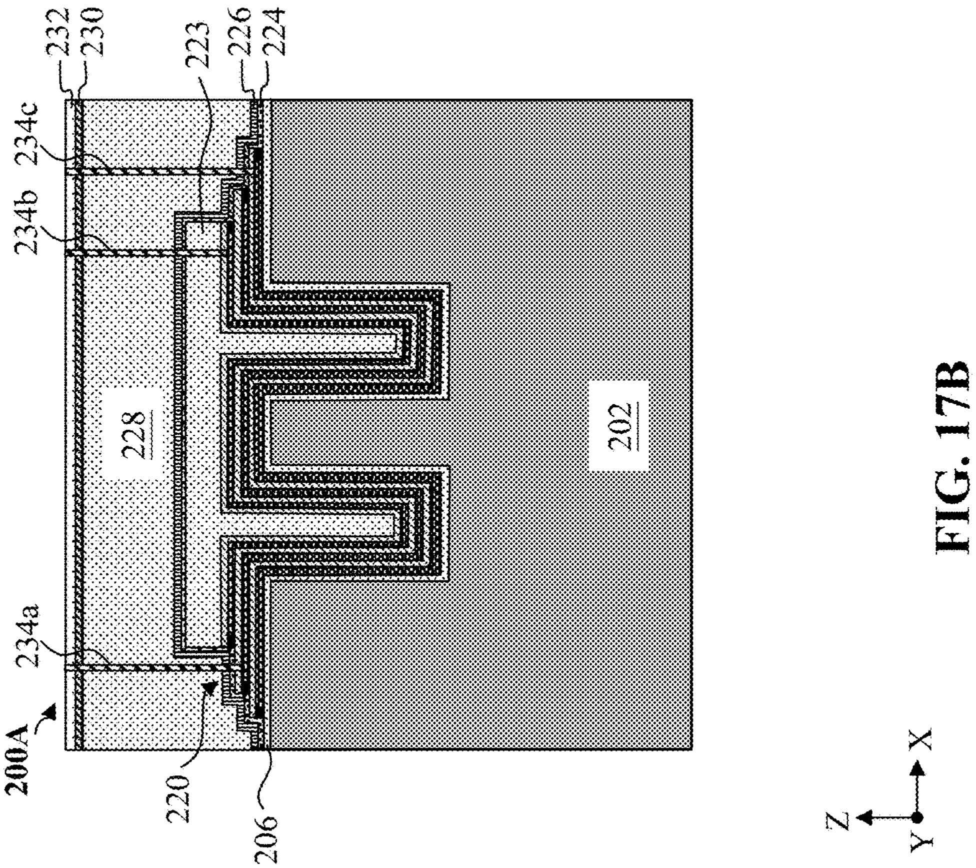
FIGS. 17A and 17B depict fragmentary cross-sectional views of an alternative workpiece, according to various aspects of the present disclosure.
Figure 17A:
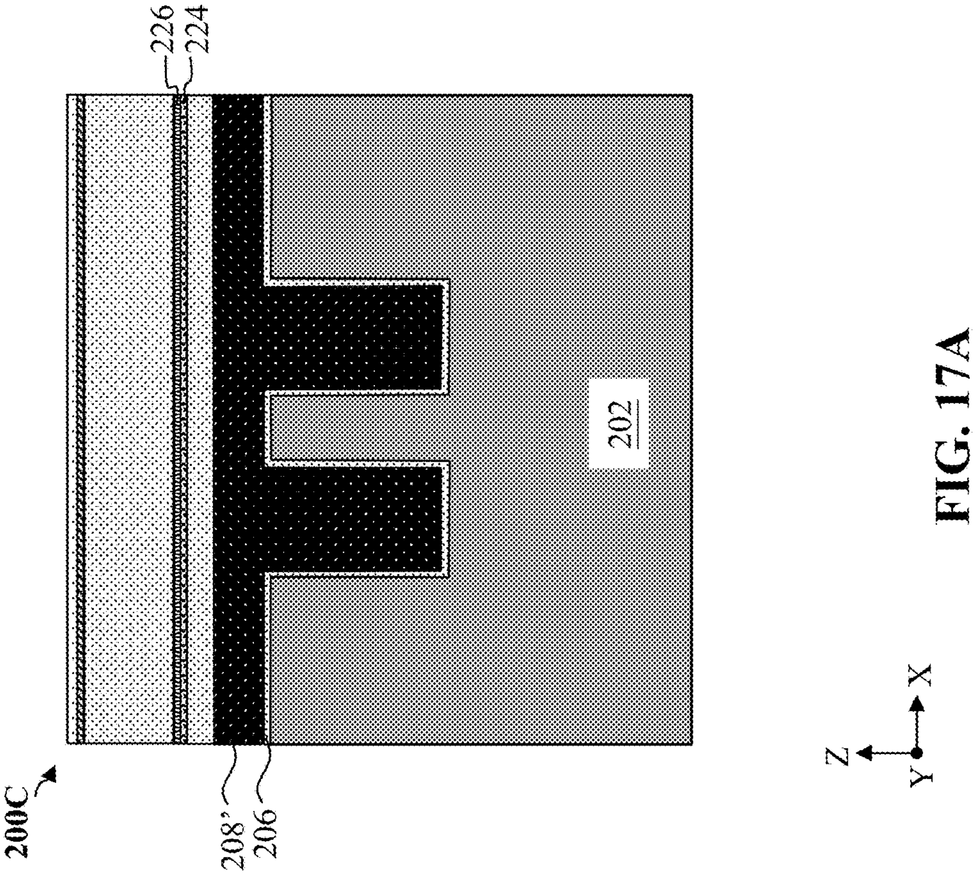
Figure 18:
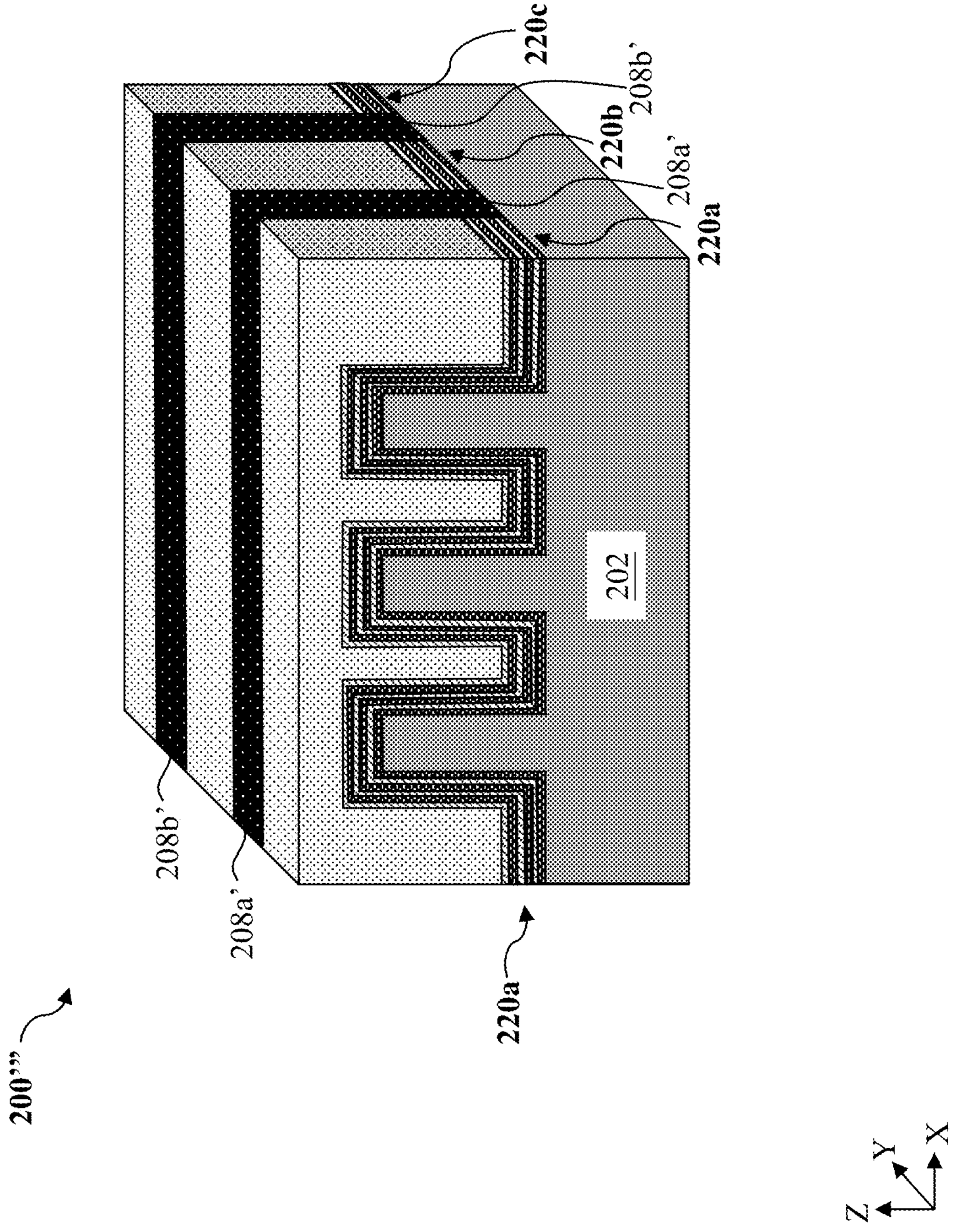
FIG. 18 is a fragmentary perspective view of a portion of the workpiece shown in FIGS. 17A and 17B, according to various aspects of the present disclosure.

In the above embodiments described with reference to FIGS. 6A-6B and 16A-16B, the formation of the blocking layer 208 includes conformally depositing the material layer over the substrate 202 and in the trenches 204 and patterning the material layer to form the blocking layer 208 in the third region 200C. The blocking layer 208 partially fills the trenches 204 in the third region 200C. However, the blocking layer 208 may be formed to substantially fill the trenches 204 in the third region 200C. For example, FIGS. 17A-17B and 18 depict a workpiece 200'''. The workpiece 200''' is similar to the workpiece 200'/200'' described with reference to FIGS. 12A-12B, 13 and 14, except that the blocking layer 208*a'*/208*b'* substantially fills the trenches 204 in the third region 200C.

Although not intended to be limiting, one or more embodiments of the present disclosure provide many benefits to a semiconductor structure and the formation thereof. For example, the present disclosure provides a blocking layer disposed between two trench capacitors, and methods of forming the same. The blocking layer is configured to isolate or couple the two trench capacitors to reduce leakage or provide a larger capacitance.

The present disclosure provides for many different embodiments. Semiconductor structures and methods of fabrication thereof are disclosed herein. In one exemplary aspect, the present disclosure is directed to a method. The method includes forming a trench extending into a substrate, wherein in a top view, the trench extends lengthwise along a first direction, forming a material layer over the substrate and intersecting a first portion of the trench, after the forming of the material layer, forming a first capacitor intersecting a second portion of the trench, the first capacitor comprising a first plurality of conductor plates, and forming a second capacitor intersecting a third portion of the trench, the second capacitor comprising a second plurality of conductor plates, where the first plurality of conductor plates and the second plurality of conductor plates are in direct contact with the material layer.

In some embodiments, the method may also include, after the forming of the material layer, performing a nitrogen treatment to the material layer to increase a resistance of the material layer. In some embodiments, the method may also include, after the forming of the material layer, performing an oxygen treatment to the material layer to increase a resistance of the material layer. In some embodiments, the material layer may include tantalum nitride, titanium nitride, molybdenum nitride, cobalt nitride, ruthenium nitride, hafnium oxide, zirconium oxide, or titanium oxide. In some embodiments, the method may also include, before the forming of material layer over the substrate, forming an oxide liner on the substrate. In some embodiments, the forming of the first capacitor may include depositing a first conductive layer over the substrate, patterning the first conductive layer to form a bottommost conductor plate in the second portion of the trench, forming a first insulator layer over the bottommost conductor plate, forming a middle conductor plate over the first insulator layer, forming a second insulator layer over the middle conductor plate, and forming a top conductor plate over the second insulator layer. In some embodiments, the patterning of the first conductive layer may also form a spacer extending along a sidewall surface of the bottommost conductor plate. In some embodiments, the spacer may include metal halides. In some embodiments, a total thickness of the first capacitor may be less than a thickness of the material layer. In some embodiments, the method may also include depositing an oxide layer over the substrate until the trench is substantially filled, and forming a passivation structure over the substrate.

In another exemplary aspect, the present disclosure is directed to a method. The method includes forming a trench extending into a substrate and extending lengthwise along a first direction, the substrate comprising a first region, a second region and a third region, the second region being disposed between the first region and the third region along the first direction, forming a material layer over the second region of the substrate, after the forming of material layer, forming a first capacitor over the first region of the substrate and a second capacitor over the third region of the substrate, wherein the first capacitor is spaced apart from the second capacitor by the material layer, and forming a passivation structure over the substrate.

In some embodiments, the material layer may include tantalum nitride, titanium nitride, molybdenum nitride, cobalt nitride, or ruthenium nitride. In some embodiments, the method may also include, after the forming of the material layer, performing a nitrogen treatment to the material layer to increase a resistance of the material layer. In some embodiments, the material layer may include hafnium oxide, zirconium oxide, or titanium oxide. In some embodiments, the method may also include, after the forming of the material layer, performing an oxygen treatment to the material layer to increase a resistance of the material layer. In some embodiments, a top surface of the material layer may be above a top surface of the first capacitor.

In yet another exemplary aspect, the present disclosure is directed to a semiconductor structure. The semiconductor structure includes a substrate comprising a first region, a second region, and a third region, the third region being disposed between the first region and the second region along a first direction. The semiconductor structure includes a first trench capacitor over the first region of the substrate, and a second trench capacitor over the second region of the substrate, and a barrier structure over the third region of the substrate, where the first trench capacitor and the second trench capacitor are separated by the barrier structure. The first trench capacitor includes a first trench extending into the substrate, and a first vertical stack of alternating conductor plates and insulator layers in the first trench. The second trench capacitor includes a second trench extending into the substrate, and a second vertical stack of alternating conductor plates and insulator layers in the second trench, where the second trench is aligned with the first trench along the first direction.

In some embodiments, the barrier structure may include a material layer formed of tantalum nitride, titanium nitride, molybdenum nitride, cobalt nitride, ruthenium nitride. In some embodiments, conductor plates in the first vertical stack and conductor plates in the second vertical stack may be in direct contact with the barrier structure. In some embodiments, a top surface of the first trench capacitor may be below a top surface of the barrier structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

patterning a substrate to form a fin-shaped structure extending lengthwise along a first direction and a trench adjacent to the fin-shaped structure in a second direction different from the first direction;

forming a conductive material layer over the fin-shaped structure and in the trench, wherein, in a top view, the conductive material layer extends lengthwise along the second direction; and forming a first capacitor and a second capacitor in the trench and over the fin-shaped structure, the first capacitor comprising a top conductor plate over a bottom conductor plate, wherein, in the top view, the conductive material layer is disposed between the first capacitor and the second capacitor in the first direction, and a topmost surface of the conductive material layer is above a topmost surface of the top conductor plate.

2. The method of claim 1, further comprising:

forming a dielectric layer over the substrate; and planarizing the dielectric layer to expose the top surface of the conductive material layer without exposing the topmost surface of the top conductor plate.

3. The method of claim 1, further comprising:

after the forming of the conductive material layer, performing a treatment to increase a resistance of the conductive material layer.

4. The method of claim 1, wherein a thickness of the conductive material layer is greater than a thickness of the first capacitor.

5. A method, comprising:

forming a trench extending into a substrate, wherein in a top view, the trench extends lengthwise along a first direction;

forming a material layer over the substrate and intersecting a first portion of the trench;

after the forming of the material layer, forming a first capacitor intersecting a second portion of the trench, the first capacitor comprising a first plurality of conductor plates; and forming a second capacitor intersecting a third portion of the trench, the second capacitor comprising a second plurality of conductor plates, wherein the first plurality of conductor plates and the second plurality of conductor plates are in direct contact with the material layer.

6. The method of claim 5, further comprising: after the forming of the material layer, performing a nitrogen treatment to the material layer to increase a resistance of the material layer.

7. The method of claim 5, further comprising: after the forming of the material layer, performing an oxygen treatment to the material layer to increase a resistance of the material layer.

8. The method of claim 5, wherein the material layer comprises tantalum nitride, titanium nitride, molybdenum nitride, cobalt nitride, ruthenium nitride, hafnium oxide, zirconium oxide, or titanium oxide.

9. The method of claim 5, further comprising:

before the forming of material layer over the substrate, forming an oxide liner on the substrate.

10. The method of claim 5, wherein the forming of the first capacitor comprises:

depositing a first conductive layer over the substrate;

patterning the first conductive layer to form a bottommost conductor plate in the second portion of the trench;

forming a first insulator layer over the bottommost conductor plate;

forming a middle conductor plate over the first insulator layer;

forming a second insulator layer over the middle conductor plate; and forming a top conductor plate over the second insulator layer.

11. The method of claim 10, wherein the patterning of the first conductive layer further forms a spacer extending along a sidewall surface of the bottommost conductor plate.

12. The method of claim 11, wherein the spacer comprises metal halides.

13. The method of claim 5, wherein a total thickness of the first capacitor is less than a thickness of the material layer.

14. The method of claim 5, further comprising:

depositing an oxide layer over the substrate until the trench is substantially filled; and forming a passivation structure over the substrate.

15. A method, comprising:

forming a trench extending into a substrate and extending lengthwise along a first direction, the substrate comprising a first region, a second region and a third region, the second region being disposed between the first region and the third region along the first direction;

forming a material layer over the second region of the substrate;

after the forming of material layer, forming a first capacitor over the first region of the substrate and a second capacitor over the third region of the substrate, wherein the first capacitor is spaced apart from the second capacitor by the material layer; and forming a passivation structure over the substrate.

16. The method of claim 15, wherein the material layer comprises tantalum nitride, titanium nitride, molybdenum nitride, cobalt nitride, or ruthenium nitride.

17. The method of claim 16, further comprising: after the forming of the material layer, performing a nitrogen treatment to the material layer to increase a resistance of the material layer.

18. The method of claim 15, wherein the material layer comprises hafnium oxide, zirconium oxide, or titanium oxide.

19. The method of claim 18, further comprising: after the forming of the material layer, performing an oxygen treatment to the material layer to increase a resistance of the material layer.

20. The method of claim 15, wherein a top surface of the material layer is above a top surface of the first capacitor.

* * * * *